United States Patent [19]
Kuroda et al.

[11] Patent Number: 5,270,944
[45] Date of Patent: Dec. 14, 1993

[54] SEMICONDUCTOR INTEGRATED CIRCUIT DEVICE AND PROCESS FOR MANUFACTURING THE SAME

[75] Inventors: Kenichi Kuroda, Tachikawa; Akinori Matsuo, Higashiyamato, both of Japan

[73] Assignees: Hitachi, Ltd., Tokyo; Hitachi VLSI Engineering Corp., Kodaira, both of Japan

[21] Appl. No.: 929,511

[22] Filed: Aug. 14, 1992

Related U.S. Application Data

[63] Continuation of Ser. No. 598,774, Oct. 18, 1990, Pat. No. 5,182,719, which is a continuation of Ser. No. 362,249, Jun. 6, 1989, abandoned.

[30] Foreign Application Priority Data

Jun. 9, 1988 [JP] Japan .................. 63-142723

[51] Int. Cl.⁵ .................. G06F 15/60; H01L 27/00
[52] U.S. Cl. .................. 364/490; 364/489; 364/488
[58] Field of Search .............. 364/488, 489, 490, 491, 364/578

[56] References Cited

U.S. PATENT DOCUMENTS 4,833,620 5/1989 Takahashi .................. 364/488
4,901,259 2/1990 Watkins .................. 364/578

*Primary Examiner*—Vincent N. Trans
*Attorney, Agent, or Firm*—Antonelli, Terry Stout & Kraus

[57] ABSTRACT

A method of fabrication comprising forming a semiconductor integrated circuit device LSI which has a microcomputer CPU furnished with an EPROM, determining a program for controlling the microcomputer CPU and to be set in the EPROM (performing an initial evaluation) while information is being written into and erased from the EPROM built in the semiconductor integrated circuit device LSI, and thereafter forming a semiconductor integrated circuit device LSI in which the EPROM of the first-mentioned semiconductor integrated circuit device LSI is replaced with a mask ROM. In replacing the EPROM with the mask ROM, peripheral circuits required for both the EPROM and the mask ROM have their circuit arrangements held basically the same, and specific peripheral circuits for use in only the EPROM have their circuit regions left as they are as logically inactive regions.

26 Claims, 13 Drawing Sheets

FIG. 5

⟨501⟩ A STEP OF FORMING AN ELEMENT ISOLATION REGION

↓

⟨502⟩ A STEP OF FORMING A GATE INSULATOR FILM AND A GATE ELECTRODE

↓

⟨503⟩ A STEP OF FORMING A DIFFUSION LAYER

↓

⟨504⟩ A STEP OF FORMING A INTERLAYER INSULATOR FILM

↓

⟨505⟩ A STEP OF FORMING A WIRING LINE

↓

⟨506⟩ A STEP OF WRITING AN INFORMATION

↓

⟨507⟩ A STEP OF FORMING A PASSIVATION FILM

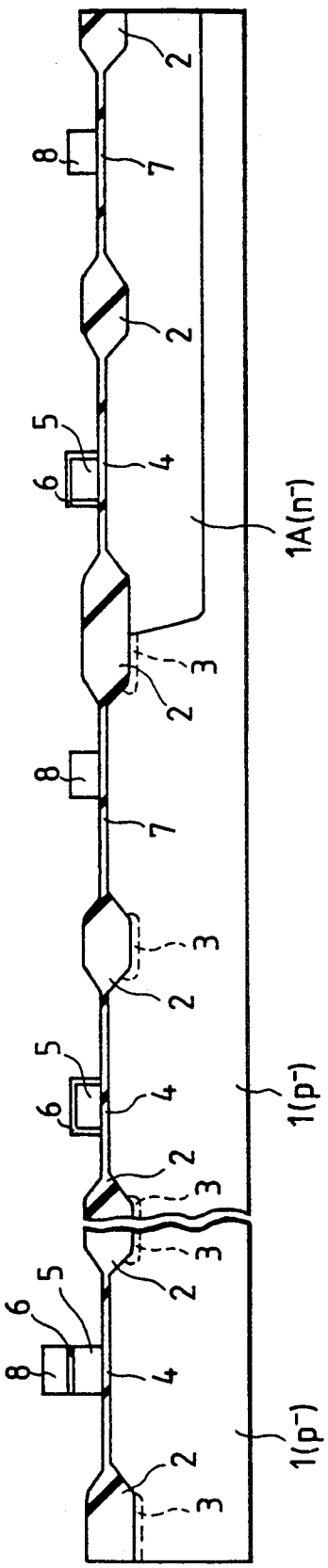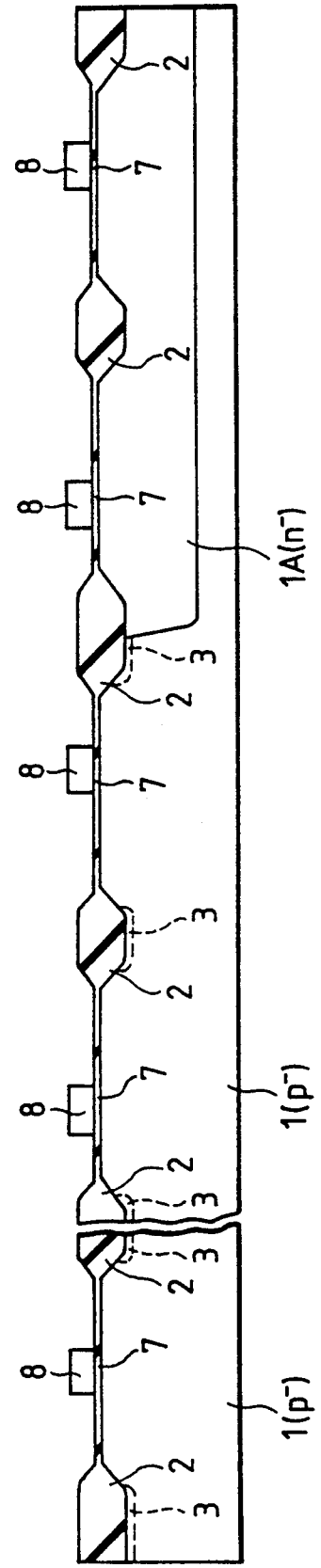

SEMICONDUCTOR INTEGRATED CIRCUIT DEVICE AND PROCESS FOR MANUFACTURING THE SAME

This is a continuation application of application Ser. No. 07/598,774, filed Oct. 18, 1990, now U.S. Pat. No. 5,182,719, which is a continuation application of application Ser. No. 07/362,249 filed Jun. 6, 1989, now abandoned.

BACKGROUND OF THE INVENTION

The present invention relates to a semiconductor integrated circuit device which is mounted on electronic apparatuses, and a method of fabricating the same. More particularly, it relates to techniques that are effective when applied to a semiconductor integrated circuit device which has a microcomputer furnished with a nonvolatile memory circuit.

In order to satisfactorily perform a so-called initial evaluation (debug) such as system check or circuit check at the initial stage of development, a semiconductor integrated circuit device (LSI) having a microcomputer to be mounted on an electronic apparatus should desirably be capable of altering internal data and internal logic with ease. It is therefore a recent trend that an EPROM (Erasable and Programmable Read Only Memory) is built in the semiconductor integrated circuit device as a memory into which microprograms, data programs etc. are written.

The EPROM is a nonvolatile memory circuit into which information is electrically written and from which information is erased with ultraviolet light, so that the information can be rewritten after the production process of the LSI. A technique of this type is described in, for example, the official gazette of Japanese Patent Application Laid-open No. 188234/1984.

More specifically, a semiconductor integrated circuit device which has a built-in EPROM as a memory for writing a program thereinto is used till the stage at which the program for controlling a microcomputer is determined by an initial evaluation.

When the initial evaluation has ended to determine the program for controlling the microcomputer, it becomes unnecessary to use the EPROM as any memory. Since the EPROM has its memory cells formed of field effect transistors of double-layer gate electrode structure, it requires a complicated production process and involves a large number of manufacturing steps. Moreover, the EPROM necessitates windows for ultraviolet erasure, which increase the fabrication cost of a package. For these reasons, the semiconductor integrated circuit device having the microcomputer furnished with the EPROM incurs a high cost of production. Besides, when the articles of the semiconductor integrated circuit device are mass-produced, the determined program needs to be written in the built-in EPROMs of the individual articles, and hence, a period of time for writing information becomes long in the semiconductor integrated circuit device which has the EPROM as a memory.

In order to avoid the above drawbacks, it is practised that, after the program has been determined by the semiconductor integrated circuit device having the microcomputer furnished with the EPROM, a semiconductor integrated circuit device having a microcomputer furnished with a mask ROM is developed anew, whereupon the determined program is set in the built-in mask ROM. The mask ROM is a nonvolatile memory circuit which serves only for reading out information, and into which the information is written in the production process thereof. The mask ROM has a simple construction in which memory cells are formed of field effect transistors of single-layer gate electrode structure, and it is fabricated by a simple production process and a small number of manufacturing steps. Moreover, since the mask ROM does not required the windows for the ultraviolet erasure in the case of the EPROM, the fabrication cost of a package can be reduced. Thus, the semiconductor integrated circuit device having the microcomputer furnished with the mask ROM is inexpensive and is suited to mass production, with the result that the cost of an electronic apparatus can be curtailed.

SUMMARY OF THE INVENTION

In the course of the development of the semiconductor integrated circuit device having the microcomputer as stated above, the inventor has found out the following problem:

In the semiconductor integrated circuit device having the microcomputer furnished with the mask ROM, the regions thereof other than the mask ROM, namely, peripheral circuits such as the microcomputer do not differ from those of the semiconductor integrated circuit device having the microcomputer furnished with the EPROM. The peripheral circuits such as the microcomputer, however, are formed by preparing anew a manufacturing mask which is used in the general production process. Therefore, an evaluation similar to the initial evaluation stated before, including the check of the manufacturing mask itself needs to be carried out again, and such operations are, in effect, equivalent to the development of a new semiconductor integrated circuit device. This has led to the problem that the development period of the semiconductor integrated circuit device having the microcomputer furnished with the mask ROM becomes very long.

An object of the present invention is to provide, in a semiconductor integrated circuit device (LSI) having a microcomputer (CPU) furnished with a nonvolatile memory circuit, a technique capable of shortening the development period of the LSI.

Another object of the present invention is to provide a technique capable of reducing the cost of an electronic apparatus on which the semiconductor integrated circuit device is mounted.

Another object of the present invention is to provide, in a semiconductor integrated circuit device having a microcomputer furnished with a first nonvolatile memory circuit, a technique capable of converting the first nonvolatile memory circuit into a second nonvolatile memory circuit at the minimum required.

The above and other objects and novel features of the present invention will become apparent from the description of this specification and the accompanying drawings.

Typical aspects of performance of the present invention are briefly summarized as follows:

A first semiconductor integrated circuit device having a CPU furnished with an EPROM (or EEPROM short for "Electrically Erasable and Programmable Read Only Memory") is formed, a program or logic for controlling the CPU is determined while information is being written into and erased from the EPROM built in the first semiconductor integrated circuit device, the EPROM of the first semiconductor integrated circuit device is converted into a mask ROM, and a second semiconductor integrated circuit device in which the determined program is set in the mask ROM is formed.

Besides, in converting the EPROM into the mask ROM, the peripheral circuits of the mask ROM are endowed with basically the same constitution as those of the EPROM, and any specific peripheral circuit for use in only the EPROM is constructed in a logically inactive state.

According to the expedients described above, the EPROM is converted into the mask ROM without changing the peripheral circuits such as a microcomputer, so that the development period of the second semiconductor integrated circuit device can be shortened in correspondence with the test periods of the peripheral circuits.

As a result, the first semiconductor integrated circuit device which is mounted on an electronic apparatus can be easily and promptly replaced with the second semiconductor integrated circuit device which is less expensive than the first one, so that the cost of the electronic apparatus can be reduced.

BRIEF DESCRIPTION OF THE DRAWING

FIG. 5 is a flow diagram of a production process for a nonvolatile memory circuit which is formed in the ROM block;

FIGS. 6B thru 6F are sectional views of essential portions showing the semiconductor integrated circuit device at the respective manufacturing steps thereof;

FIGS. 7B thru 7F are sectional views of essential portions showing the semiconductor integrated circuit device at the respective manufacturing steps thereof;

DESCRIPTION OF THE PREFERRED EMBODIMENTS

Throughout the drawings for describing embodiments, the same symbols are assigned to components having identical functions, which shall not be repeatedly explained.

Embodiment I

Figure 1:
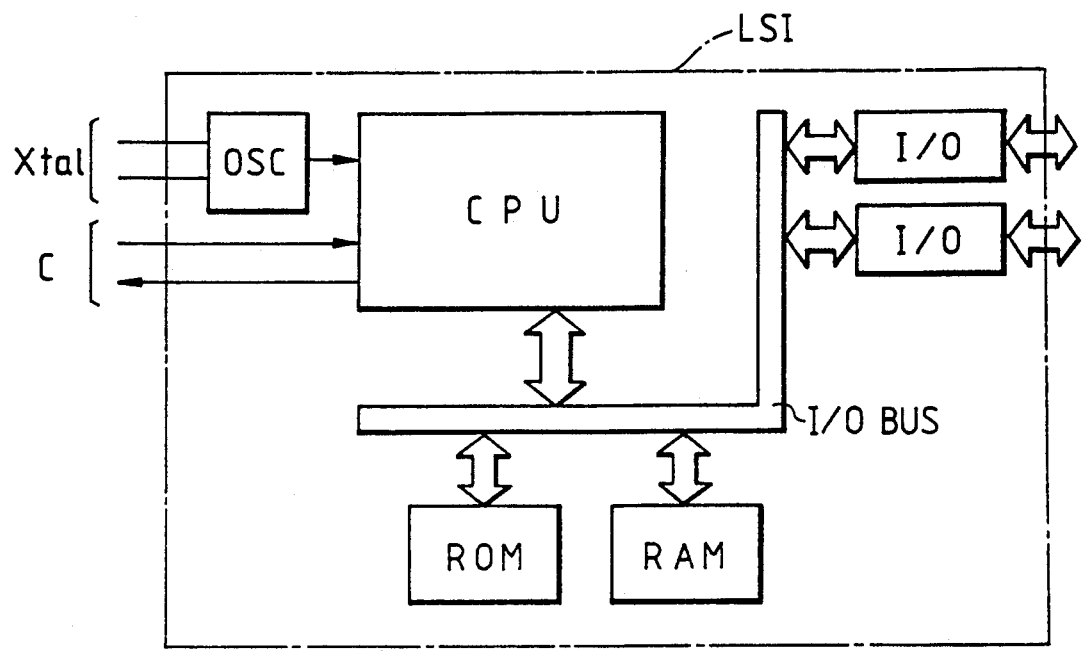
FIG. 1 is a block layout diagram of that semiconductor integrated circuit device having a microcomputer which is Embodiment I of the present invention.

That semiconductor integrated circuit device having a microcomputer which is Embodiment I of the present invention is shown in FIG. 1 (a block layout diagram).

As illustrated in FIG. 1, the semiconductor integrated circuit device LSI is a portion enclosed with a dot-and-dash line and constructs a single-chip microcomputer.

Symbol CPU denotes the microcomputer (microprocessor). Symbols I/O denote input/output ports, each of which includes a data transfer direction register therein. Shown at symbol OSC is an oscillation circuit. Although not especially restricted, the oscillation circuit OSC forms a reference frequency signal of high accuracy by the use of a quartz-crystal oscillator Xtal connected outside the device LSI, so as to generate clock pulses necessary for the microcomputer CPU. A block RAM is a random access memory (volatile memory circuit), which is mainly used as a temporary storage circuit for a program under execution and data in the course of processing. A block ROM is a read only memory (nonvolatile memory circuit), in which the programs, dictionary data, etc. of various sorts of information processing are stored. Each of the random access memory RAM and the read only memory ROM includes a control circuit which is required for the reading operations and writing operations of memory cells. In addition, the circuit blocks mentioned above are interconnected round the microcomputer CPU by an input/output bus I/O BUS. The input/output bus I/O BUS includes a data bus and an address bus.

Figure 2:
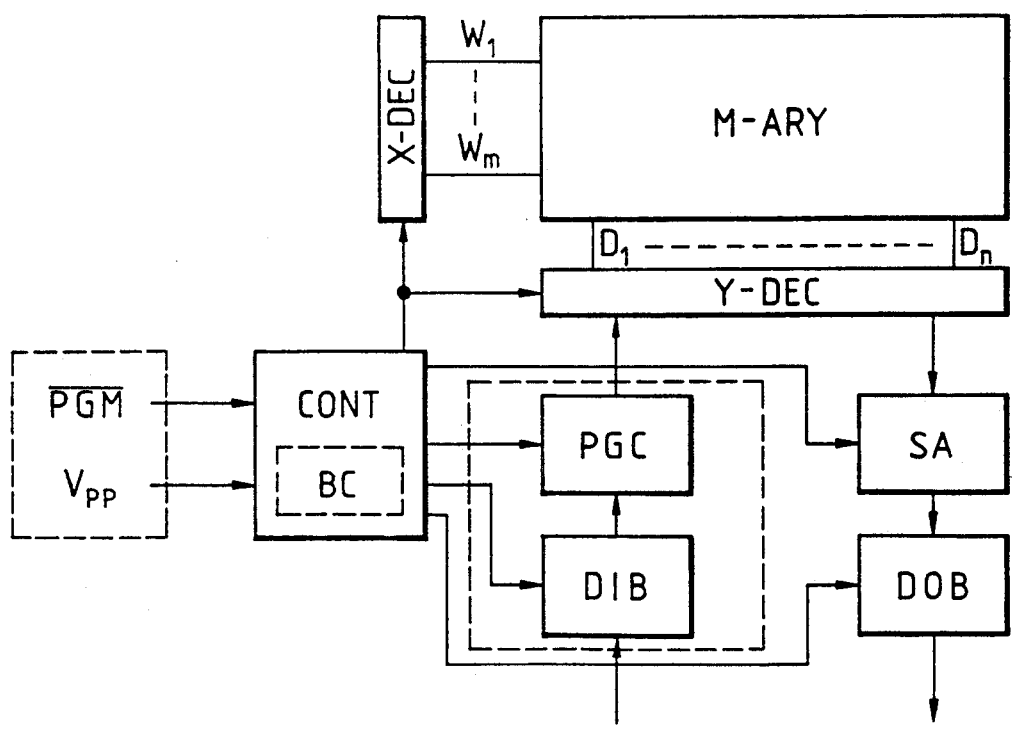
FIG. 2 is a block layout diagram of a ROM in the semiconductor integrated circuit device shown in FIG. 1.

The read only memory ROM built in the semiconductor integrated circuit device LSI is constructed as shown in FIG. 2 (a block layout diagram of the ROM). A memory cell array M-ARY is so constructed that the plurality of memory cells are arranged in the shape of a matrix, and that word lines $W_1$-$W_m$ and data lines $D_1$-$D_n$ are respectively extended. An X-decoder circuit X-DEC is constructed so as to select the word line W. A Y-decoder circuit Y-DEC is constructed so as to select the data line D. Although no special restriction is intended, both the X-decoder circuit X-DEC and the Y-decoder circuit Y-DEC are controlled by the microcomputer CPU through the control circuit CONT.

A sense amplifier SA is constructed so as to decide whether the signal of the memory cell delivered to the data line D in the operation of reading information is at a "high" level or a "low" level, and to deliver the decided level to the input/output bus I/O BUS through a data out buffer DOB. The control of delivering the output is performed by the microcomputer CPU through the control circuit CONT.

The X-decoder circuit X-DEC and Y-decoder circuit Y-DEC constitute a decoder circuit. The sense amplifier SA, data out buffer DOB and control circuit CONT constitute a reading-system circuit.

Figure 3A:
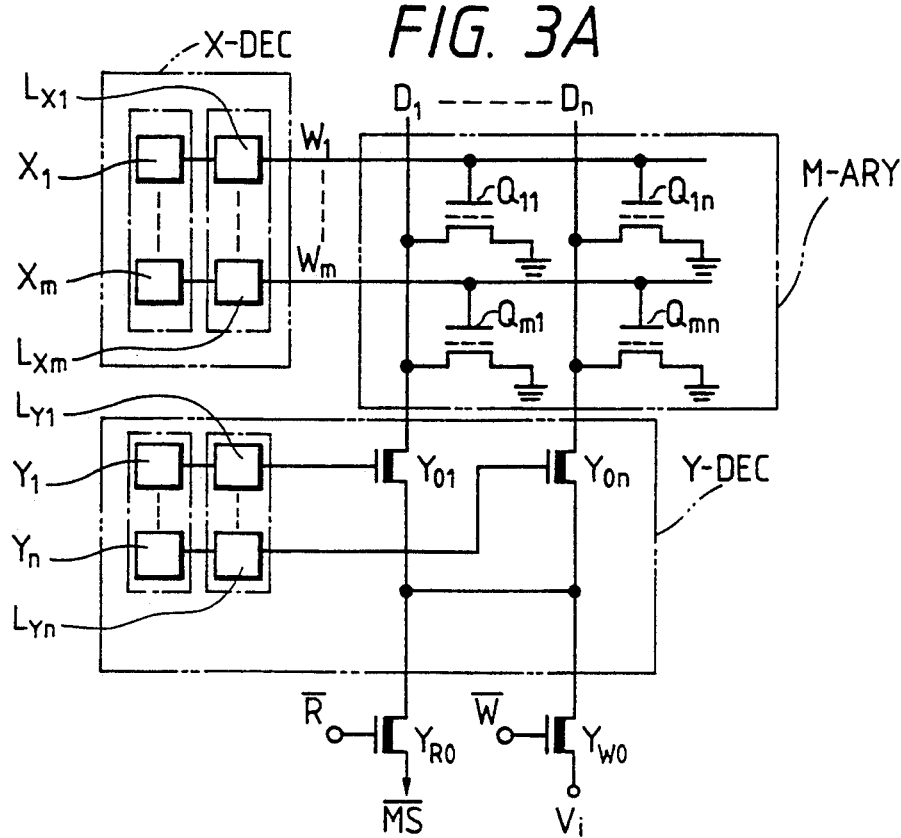
FIG. 3A is an equivalent circuit diagram of an EPROM which is formed in the ROM block.
Figure 3B:
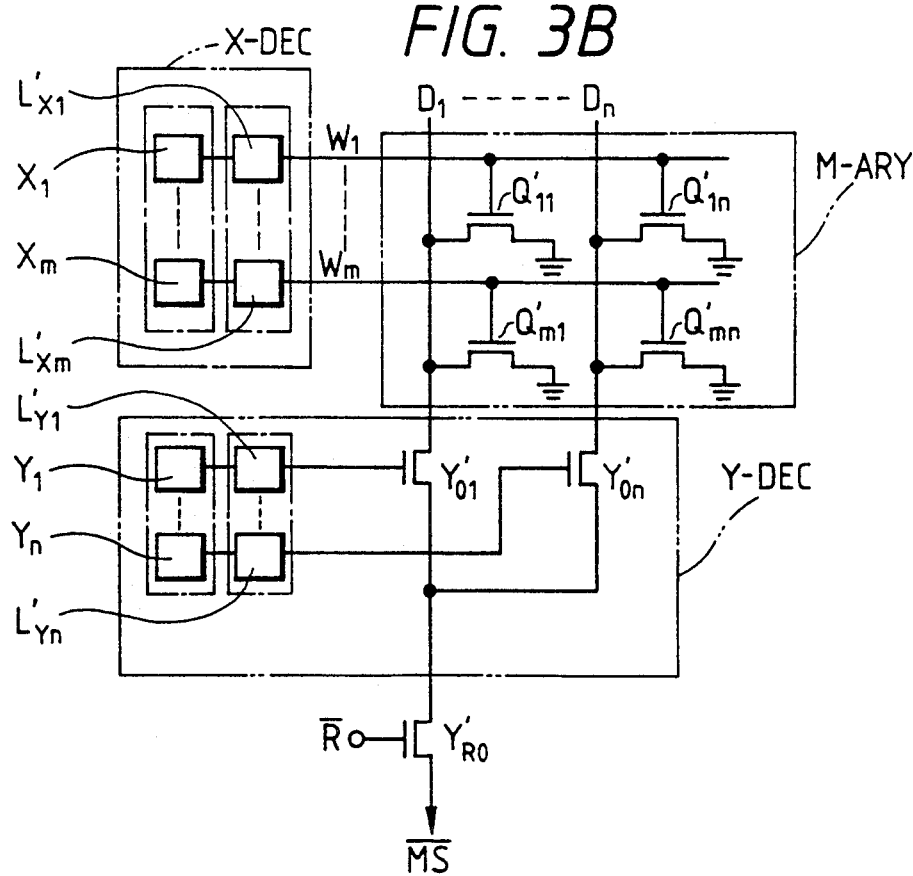
FIG. 3B is an equivalent circuit diagram of a mask ROM which is formed in the ROM block.

This read only memory ROM is formed of an EPROM shown in FIG. 3A (an equivalent circuit diagram), or a mask ROM shown in FIG. 3B (an equivalent circuit diagram).

The EPROM is a nonvolatile memory circuit into which information is electrically written and from which information is erased by ultraviolet light. The EPROM is adapted to have the information written and erased after the production process of the semiconductor integrated circuit device LSI. This EPROM is built in the semiconductor integrated circuit device LSI for initially evaluating (debugging) the X-decoder circuit X-DEC, Y-decoder circuit Y-DEC, etc. which are the direct peripheral circuits of the read only memory ROM, and the microcomputer CPU, random access memory RAM, etc. which are the indirect peripheral circuits thereof. The initial evaluation performs the system check and circuit checks of the circuit blocks, and especially determines a data program as well as a microprogram for controlling the microcomputer CPU. That is, the EPROM is adapted to carry out the initial evaluation including the determination of the programs while having the information written and erased repeatedly.

As shown in FIG. 3A, the memory cell array M-ARY of the EPROM is such that the memory cells $Q_{11}, \ldots$ and $Q_{mn}$ are arranged at the intersection parts between the word lines $W_1$-$W_m$ and the data lines $D_1$-$D_n$. Each of the memory cells Q is basically constructed of a field effect transistor FET of double-layer gate electrode structure which has a control gate electrode and a floating gate electrode for storing charges as information.

The X-decoder circuit X-DEC is chiefly configured of unit X-decoder circuits $X_1$-$X_m$ and X-level shifter circuits $L_{X1}$-$L_{Xm}$.

The unit X-decoder circuits $X_1$-$X_m$ and the X-level shifter circuits $L_{X1}$-$L_{Xm}$ are respectively connected so as to correspond to the word lines $W_1$-$W_m$.

The word line W is selected by the corresponding unit X-decoder circuit. The corresponding X-level shifter circuit sets the selected word line W at a boosted voltage $V_{pp1}$ (about 14 [V]) in a write mode, and at a power source voltage $V_{cc}$ (about 5 [V]) in a read mode.

The Y-decoder circuit Y-DEC is chiefly configured of unit Y-decoder circuits $Y_1$-$Y_n$, Y-level shifter circuits $L_{Y1}$-$L_{Yn}$ and column switch MIS (Metal-Insulator-Semiconductor) FETs $Y_{O1}$-$Y_{On}$.

The unit Y-decoder circuits $Y_1$-$Y_n$ and the Y-level shifter circuits $L_{Y1}$-$L_{Yn}$ are respectively connected to the column switch MISFETs $Y_{O1}$-$Y_{On}$ for selecting the corresponding data lines $D_1$-$D_n$.

The unit Y-decoder circuit and the Y-level shifter circuit have basically the same structures as those of the unit X-decoder circuit and the X-level shifter circuit, respectively.

The column switch MISFET is selected by the corresponding unit Y-decoder circuit, whereby the data line is selected.

In the read mode, a read signal $\overline{R}$ is output from the control circuit CONT so as to bring a read select MISFET $Y_{RO}$ into its ON state. Thus, the signal $\overline{MS}$ of the memory cell delivered to the data line D is sensed by the sense amplifier SA.

In the write mode, a write signal $\overline{W}$ is output from the control circuit CONT so as to bring a write select MISFET $Y_{WO}$ into its ON state, and simultaneously, a voltage $V_i$ is set at a write voltage $V_{pp}$ by a program circuit PGC to be described later. Thus, the selected data line D is set at the write voltage $V_{pp}$, and information is written into the selected memory cell.

The write voltage $V_{pp}$ is set at substantially the same level as that of a write reference voltage of about 12.5 [V] supplied from outside. (Hereinbelow, the write reference voltage shall be simply termed the "write voltage $V_{pp}$".)

Since the column switch MISFETs, write select MISFET and read select MISFET have the high voltages (the boosted voltage $V_{pp1}$, etc.) applied thereto in the write mode, they are constructed of high breakdown voltage MISFETs (HMISs) of, for example, n-channel type.

Figure 4A:
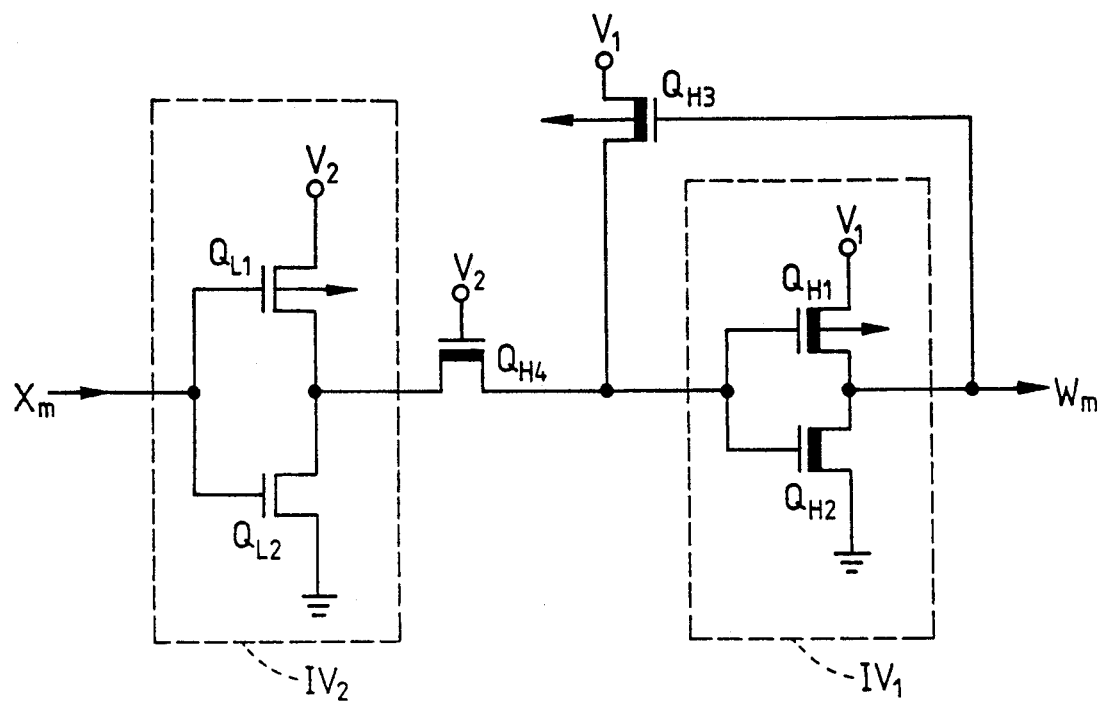
FIG. 4A is an equivalent circuit diagram of an X-level shifter circuit in the EPROM which is formed in the ROM block.

As shown in FIG. 4A, the X-level shifter circuit is chiefly configured of inverter circuits $IV_1$ and $IV_2$ each of which is based on CMIS (Complementary Metal-Insulator-Semiconductor) FETs.

The inverter circuit $IV_1$ is configured of a p-channel type MISFET $Q_{H1}$ and an n-channel type MISFET $Q_{H2}$.

The MISFETs $Q_{H1}$ and $Q_{H2}$, and MISFETs $Q_{H3}$ and $Q_{H4}$ are high breakdown voltage MISFETs (HMISs).

Either the sources or the drains of the high breakdown voltage MISFETs (HMISs) $Q_{H1}$ and $Q_{H3}$ are set at a predetermined voltage $V_1$ by the control circuit CONT.

The control circuit CONT includes a booster circuit BC for raising the write voltage $V_{pp}$ to the boosted voltage $V_{pp1}$, and sets the voltage $V_1$ at the boosted voltage $V_{pp1}$ in the write mode. In the read mode, the voltage $V_1$ is set at the power source voltage $V_{cc}$.

The inverter circuit $IV_2$ is configured of a p-channel type MISFET $Q_{L1}$ and an n-channel type MISFET $Q_{L2}$.

The potential $V_2$ of either the source or the drain of the MISFET $Q_{L1}$ and the gate electrode of the MISFET $Q_{H4}$ is set at (or connected to) the power source potential $V_{cc}$.

The thickness $t_{ox2}$ of the common gate insulator film of the MISFETs $Q_{L1}$ and $Q_{L2}$ is equalized to that of the gate insulator films of the MISFETs constituting the circuits (for example, the sense amplifier SA and the data out buffer DOB) to which the high voltages (the write voltage $V_{pp}$, etc.) are not applied.

The thickness $t_{ox1}$ of the gate insulator films of the high breakdown voltage MISFETs (HMISs) is set to be greater than the thickness $t_{ox2}$ of the gate insulator films of the MISFETs to which the high voltages (the write voltage $V_{pp}$, etc.) are not applied.

In this manner, the EPROM is constructed of the MISFETs whose gate insulator films have the thickness $t_{ox2}$ less than the thickness $t_{ox1}$, except the high breakdown voltage MISFETs (HMISs) whose gate insulator films have the thickness $t_{ox1}$.

Incidentally, the MISFETs to which the high voltages (the write voltage $V_{pp}$, etc.) are not applied need not always have the gate insulator films at the thickness $t_{ox2}$, but they may well have gate insulator films at a plurality of thicknesses less than the thickness $t_{ox1}$.

Meanwhile, the mask ROM is a nonvolatile memory circuit which is dedicated to read information therefrom and which is adapted to have the information written thereinto in the production process of the semiconductor integrated circuit device LSI. This mask ROM stores therein the same program as that program (information) for controlling the microcomputer CPU which has been written into the EPROM in the initial evaluation.

As shown in FIG. 3B, the memory cell array M-ARY of the mask ROM is such that the memory cells $Q_{11}'$, ... and $Q_{mn}'$ are arranged at the intersection parts between the word lines $W_1-W_m$ and the data lines $D_1-D_n$. Each of the memory cells $Q'$ is basically constructed of a field effect transistor having a single-layer gate electrode structure.

In addition, each of the X-decoder circuit X-DEC, Y-decoder circuit Y-DEC, sense amplifier SA and data out buffer DOB of the read only memory ROM is the direct peripheral circuit which can be used in common for the information reading operations of both the EPROM and the mask ROM. It is therefore constructed of substantially the same structure in both the cases of the EPROM and the mask ROM.

Figure 4B:
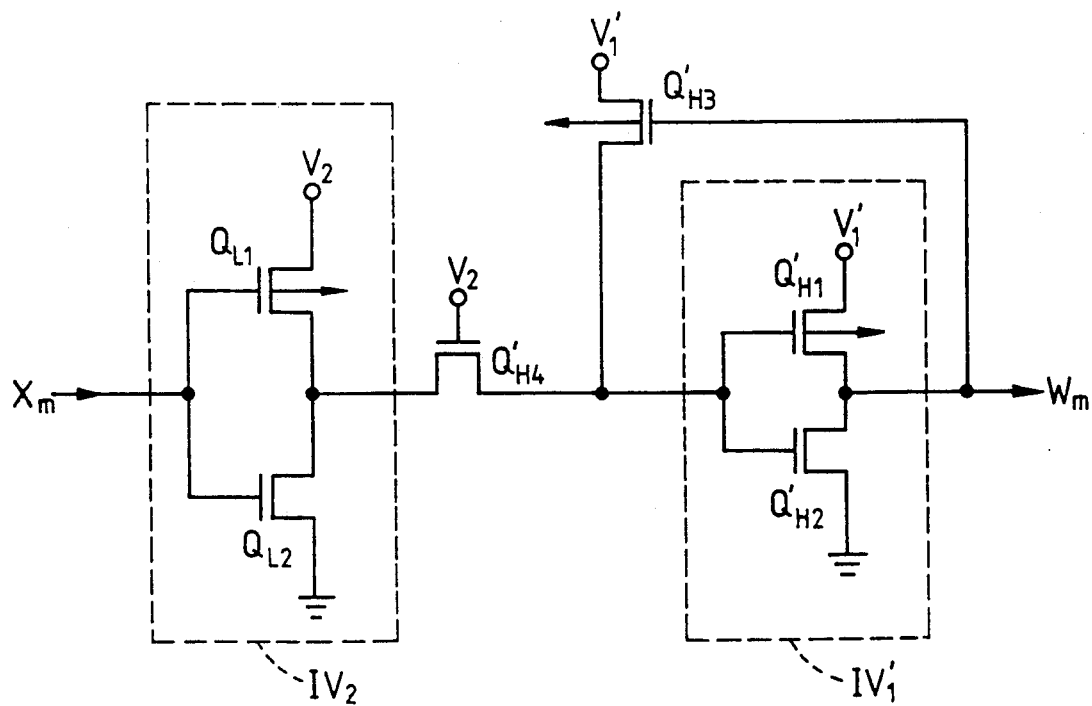
FIG. 4B is an equivalent circuit diagram of an X-level shifter circuit in the mask ROM which is formed in the ROM block.

As illustrated in FIGS. 3B and 4B by way of example, the mask ROM has a circuit arrangement, a layout, etc. substantially identical to those of the EPROM, except that the high breakdown voltage MISFETs (HMISs) having the gate insulator films of the thickness $t_{ox1}$ as used for the unit X- and Y-decoder circuits, column switch MISFETs, read select MISFET, etc. of the EPROM are replaced with the MISFETs having the gate insulator films of the thickness $t_{ox2}$ in the mask ROM.

More specifically, the column switch MISFETs $Y_{O1}'-Y_{On}'$ and read select MISFET $Y_{RO}'$ of the mask ROM are the MISFETs having the gate insulator films of the smaller thickness $t_{ox2}$.

As shown in FIG. 4B, MISFETs $Q_{H1}'$, $Q_{H2}'$, $Q_{H3}'$ and $Q_{H4}'$ in the X-level shifter circuit of the mask ROM have their insulator films formed at the smaller thickness $t_{ox2}$.

Besides, when the EPROM has been substituted by the mask ROM, the voltage $V_1'$ of either the sources or drains of the MISFETs $Q_{H1}'$ and $Q_{HE}'$ is set at (or connected to) the power source voltage $V_{cc}$.

In the reading operation of the EPROM, the selected word line W is set at substantially the same level as that of the power source voltage $V_{cc}$ externally supplied, while the selected data line D is set at $\frac{1}{4} V_{cc} - \frac{1}{3} V_{cc}$ lower than the power source voltage $V_{cc}$ in order to prevent erroneous writing during the reading operation. Even when the EPROM has been substituted by the mask ROM, this mask ROM has the circuit arrangement which holds the levels of the word line W and data line D substantially identical to the above. Moreover, the EPROM and the mask ROM are respectively designed so as to be operable with such a circuit arrangement.

As the direct peripheral circuits (an information writing-system circuit) which are specific to the EPROM and which are not included in the mask ROM, there are the booster circuit BC, a data in buffer DIB and the program circuit PGC as enclosed with broken lines in FIG. 2. These peripheral circuits are used in the information writing operation of the EPROM.

These peripheral circuits are chiefly configured of high breakdown voltage MISFETs.

They are supplied with the power source voltage $V_{cc}$ or the write voltage $V_{pp}$ (or the boosted voltage $V_{pp1}$).

Information is written into the EPROM in such a way that the information to be written is input to the program circuit PGC from the input/output bus I/O BUS through the data in buffer DIB or directly from outside the EPROM, while at the same time, the write voltage $V_{pp}$ and write control signals such as a program control signal $\overline{PGM}$ are input to the program circuit PGC through the control circuit CONT, whereby the program circuit PGC delivers the write voltage $V_{pp}$ by way of example.

The direct peripheral circuits (information writing-system circuit) specific to the EPROM are constructed so as to remain in a logically inactive state in the semiconductor integrated circuit device LSI when the EPROM has been substituted by the mask ROM. By way of example, the information writing-system circuit is brought into the logically inactive state by control signals with the circuit patterns thereof left as they are.

The logically inactive state is established in such a way that wiring for supplying the writing-system circuit with, for example, the power source voltage $V_{cc}$ or the write voltage $V_{pp}$ (or the boosted voltage $V_{pp1}$) in the EPROM is connected to a ground potential (GND) $V_{ss}$ in the mask ROM.

Alternatively, the output wiring of the information writing-system circuit may well be laid so as not to connect with any other circuit.

Further, the information writing-system circuit may well be brought into the logically inactive state without forming the circuit patterns (without forming the elements thereof) though regions for forming the circuit are left behind.

More specifically, when the EPROM has been substituted by the mask ROM, each of the specific peripheral circuits for use in only the EPROM has the circuit region left as it is and does not have the circuit pattern formed, whereby the logically inactive state can be reliably established.

By way of example, as seen from FIG. 3B, the write select MISFET $Y_{WO}$ which is the specific peripheral circuit for use in only the EPROM is brought into the logically inactive state without forming the circuit pattern.

Next, a method of converting the built-in EPROM of the semiconductor integrated circuit device LSI into the mask ROM will be described with reference to FIG. 1, FIG. 2, FIGS. 3A and 3B and FIGS. 4A and 4B. Here, the EPROM is such that each memory cell is constructed of the field effect transistor having the double-layer gate electrode structure, the first-layer gate electrode of which forms the floating gate electrode and the second-layer gate electrode of which forms the control gate electrode and the word line extending therefrom.

In addition, the peripheral circuits of the EPROM are constructed of the high breakdown voltage MISFETs (HMISs) having the gate insulator films of the thickness $t_{ox1}$ and the MISFETs having the gate insulator films of the thickness $t_{ox2}$ smaller than the thickness $t_{ox1}$.

Besides, the circuit blocks shown in FIG. 1 except the block of the read only memory ROM are constructed of the field effect transistors having the single-layer gate electrode structure which is formed by the second-layer gate electrodes.

(1) Memory Cell Array M-ARY

The floating gate electrodes which are specific to the field effect transistors serving as the memory cells of the EPROM are removed, thereby to construct the mask ROM whose memory cells are formed of the field effect transistors of the single-layer gate electrode structure. That is, since the floating gate electrodes are formed of the first-layer gate electrodes in the EPROM, the step of forming the first-layer gate electrodes is omitted in the case of the mask ROM replacing the EPROM. The circuit blocks except the block of the read only memory ROM are constructed of the MISFETs having the second-layer gate electrodes, so that any structural change or any change in electrical characteristics does not occur due to the replacement of the EPROM with the mask ROM. Moreover, as seen from FIGS. 3A and 3B, the memory cells of the EPROM are arranged in parallel, so that the EPROM can be easily substituted by a lateral mask ROM (a mask ROM whose memory cells are arranged in parallel).

(2) Decoder Circuits DEC and Reading-system Circuit

Information written into the memory cell array M-ARY is read out by the X-decoder circuit, Y-decoder circuit, sense amplifier SA, data out buffer DOB and control circuit CONT. As described before, the circuit arrangement is so designed that these direct peripheral circuits for use in the reading operation can be shared by the EPROM and the mask ROM. Therefore, in replacing the EPROM with the mask ROM, the circuit arrangement of the former need not be basically altered.

Since, however, the EPROM uses the high voltage for the writing operation, the gate electrodes of the field effect transistors of the direct peripheral circuits are sometimes formed of the double-layer gate electrode structure composed of the first-layer and second-layer gate electrodes or sometimes formed of the single-layer gate electrode structure composed of only the first-layer or second-layer gate electrode, in relation to the structures of the FETs. In any case, the direct peripheral circuits are constructed of the field effect transistors of the single-layer gate electrode structure composed of only the second-layer gate electrode when the EPROM is substituted by the mask ROM.

Incidentally, the high breakdown voltage MISFETs having the gate insulator films of the thickness $t_{ox1}$ in the EPROM are substituted by the MISFETs having the gate insulator films of the thickness $t_{ox2}$ in the mask ROM replacing the EPROM.

On this occasion, circuit constants may well be altered though no special restriction is intended. Besides, in the former case mentioned above where the peripheral circuit is constructed of the field effect transistors of the double-layer gate electrode structure, a short-circuiting part appears in the mask ROM replacing the EPROM when the first-layer gate electrode and the second-layer gate electrode intersect in plan through an inter-layer insulator film. Therefore, in the case where the peripheral circuit is configured of the field effect transistors of the double-layer gate electrode structure in the EPROM, the mask pattern thereof is formed beforehand so that the gate electrodes of both the layers in an active state may not intersect in plan.

(3) Writing-system Circuit

The information writing-system circuit is mainly used in the case of the EPROM, and is chiefly constructed of the program circuit PGC, data in buffer DIB, program control circuit $\overline{PGM}$, write voltage $V_{pp}$ and control circuit CONT. Those parts of this writing-system circuit which are not used in the mask ROM, except the control circuit CONT, are constructed in the logically inactive state as described before when the EPROM is replaced with the mask ROM.

(4) Another Point

Although not illustrated in the drawings, the EPROM has a circuit which permits the memory cell array M-ARY thereof to be accessed directly from outside the device LSI. Even in the mask ROM replacing the EPROM, the circuit is held active so that the memory cell array of the mask ROM may be directly accessible. Thus, the data check of the mask ROM is facilitated.

As thus far described, when the EPROM is substituted by the mask ROM, the circuit regions and circuit arrangements of the memory cell array M-ARY and peripheral circuits are not changed, and the writing-system circuit for use in only the EPROM is brought into the logically inactive state.

In this way, the substitution of the semiconductor integrated circuit device LSI having the built-in EPROM by the semiconductor integrated circuit device LSI having the built-in mask ROM can be effected by minimizing the design alterations of the circuit arrangement etc., and the initial evaluation including the system check, the circuit checks etc. can be simplified. It is accordingly possible to shorten the development period of the semiconductor integrated circuit device LSI having the built-in mask ROM.

Next, regarding the case where the semiconductor integrated circuit device LSI with the built-in EPROM has its EPROM replaced with the mask ROM and is fabricated into the semiconductor integrated circuit device LSI with the built-in mask ROM, the basic concept of a fabricating method will be described with reference to FIG. 5 (a flow diagram of manufacturing steps).

As shown in FIG. 5, first of all, an element isolation region is formed <step 501>. The step of forming the element isolation region serves for isolating individual semiconductor elements to be formed on a semiconductor substrate later, and is the step of forming a thick field insulator film produced by, for example, selective oxidation process. In addition, a p-type well region and an n-type well region are formed by this step. This step is common to both the EPROM and the mask ROM.

Subsequently, a gate insulator film and a gate electrode are formed <step 502>. The step of forming the gate insulator film and the gate electrode is the step of forming the gate insulator film and gate electrode of each field effect transistor. In the case of the EPROM, this step is the step of forming gate electrodes of two layers because the field effect transistor has the double-layer gate electrode structure, whereas in the case of the mask ROM, this step is the step of forming a gate electrode of single layer because the field effect transistor has the single-layer gate electrode structure. This step includes the step of introducing an impurity for adjusting the threshold voltage of the field effect transistor.

Subsequently, a diffusion layer is formed <step 503>. The step of forming the diffusion layer is the step of forming the source region and drain region of each field effect transistor. Here, an n-type impurity is introduced for the n-channel field effect transistor, and a p-type impurity for the p-channel field effect transistor. This step of forming the diffusion layer is common to both the EPROM and the mask ROM.

At the next step, an interlayer insulator film is formed <step 504>. The step of forming the interlayer insulator film is the step of forming the insulator film which electrically isolates the field effect transistor and a wiring line overlying it. The interlayer insulator film is formed of a single layer such as a silicon oxide film deposited by CVD (Chemical Vapor Deposition), a PSG (Phospho-Silicate Glass) film or a BPSG (Boron-doped Phospho-Silicate Glass) film, or a composite film in which such films are combined. This step of forming the interlayer insulator film is common to both the EPROM and the mask ROM.

Next, the wiring line is formed <step 505>. The step of forming the wiring line includes the step of forming each contact hole for the connection between individual semiconductor elements, and the step of forming the wiring line of aluminum or the like. This step of forming the wiring line is common to both the EPROM and the mask ROM.

Subsequently, information is written <step 506>. The step of writing the information is the step of introducing a predetermined impurity, for example, boron B into the channel forming region of a predetermined MISFET by ion implantation, so as to change the threshold voltage of the MISFET. This step of writing the information is included in only the mask ROM.

Subsequently, a passivation film is formed <step 507>. The step of forming the passivation film is the step of forming the final passivation film which covers the whole front surface of the semiconductor device. The passivation film is formed of, for example, a PSG film or a silicon nitride film. This step of forming the passivation film is common to both the EPROM and the mask ROM.

Now, the structure of the semiconductor integrated circuit device LSI having the built-in EPROM and a practicable method of fabricating this device LSI will be described with reference to FIG. 6A (a sectional view of essential portions) and FIGS. 6B thru 6F (sectional views of the essential portions shown at respective manufacturing steps). Further, the structure of the semiconductor integrated circuit device LSI in which the EPROM is replaced with the mask ROM and a practicable method of fabricating this device LSI will be described with reference to FIG. 7A (a sectional view of essential portions) and FIGS. 7B thru 7F (sectional views of the essential portions shown at respective manufacturing steps).

Figure 6A:
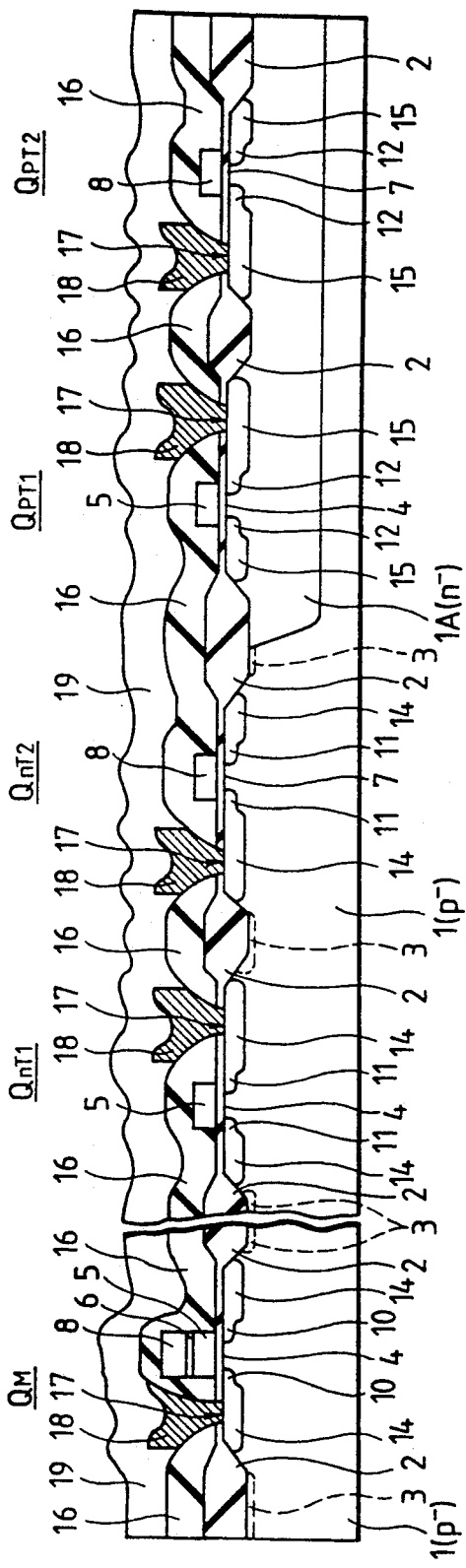
FIG. 6A is a section view of the essential portions of the semiconductor integrated circuit device.

As shown in FIG. 6A, the semiconductor integrated circuit device LSI includes the built-in EPROM in which each memory cell is constructed of a field effect transistor $Q_M$. The field effect transistor $Q_M$ is formed on the principal surface of a $p^-$-type semiconductor substrate 1 made of single-crystal silicon. It is configured of a gate insulator film 4, a floating gate electrode 5 (first-layer gate electrode), a gate insulator film 6, a control gate electrode 8 (second-layer gate electrode), and a pair of n-type semiconductor regions 10 and a pair of $n^+$-type semiconductor regions 14 serving as source and drain regions. Thus, the field effect transistor $Q_M$ is constructed of the double-layer gate electrode structure.

The n-type semiconductor regions 10 at a low impurity concentration are respectively interposed between the $n^+$-type semiconductor regions 14 at a high impurity concentration and the channel forming region of the field effect transistor $Q_M$. These n-type semiconductor regions 10 constitute the field effect transistor so-called LDD (Lightly Doped Drain) structure. They are formed in self-alignment with the gate electrode 8. The $n^+$-type semiconductor regions 14 of the high impurity concentration are formed in self-alignment with the gate electrode 8 through side-wall spacers 13.

Field effect transistors (MISFETs) $Q_{nT1}$, $Q_{nT2}$, $Q_{pT1}$ and $Q_{pT2}$ formed on the principal surface of the identical semiconductor substrate 1 constitute peripheral circuits, respectively. In this embodiment, the circuit blocks serving as the indirect peripheral circuits, except the read only memory ROM, are configured of the field effect transistors $Q_{nT2}$ and $Q_{pT2}$. Each of these field effect transistors $Q_{nT2}$ and $Q_{pT2}$ is constructed of the single-layer gate electrode structure which has a gate electrode 8 formed of the same conductor layer as that of the control gate electrode 8 of the field effect transistor $Q_M$. On the other hand, the direct peripheral circuits of the read only memory ROM are configured of the respective field effect transistors $Q_{nT1}$, $Q_{nT2}$, $Q_{pT1}$ and $Q_{pT2}$. Each of the field effect transistors $Q_{nT1}$ and $Q_{pT1}$ is constructed of the single-layer gate electrode structure which has a gate electrode 5 formed of the same conductor layer as that of the floating gate electrode 5 of the field effect transistor $Q_M$.

Incidentally, the field effect transistors $Q_{pT1}$ and $Q_{pT2}$ are p-channel MISFETs formed in an $n^-$-type well region 1A, and the peripheral circuits are mainly configured of C-MISFETs (complementary MISFETs) as illustrated in FIG. 6A.

In addition, the field effect transistors $Q_{nT1}$, $Q_{nT2}$, $Q_{pT1}$ and $Q_{pT2}$ are constructed of the LDD structure.

The field effect transistors $Q_{nT1}$ and $Q_{pT1}$ are high breakdown voltage MISFETs (HMISs), and the thickness $t_{ox1}$ of the gate insulator films of these field effect transistors $Q_{nT1}$ and $Q_{pT1}$ is greater than the thickness $t_{ox2}$ of the gate insulator films of the field effect transistors $Q_{nT2}$ and $Q_{pT2}$.

By the way, the high breakdown voltage MISFETs are not restricted to the LDD structure, but they may well be constructed of any other structure adapted to enhance a margin against a breakdown voltage, such as a DD (Double Drain) structure and off-set gate structure.

Referring to FIG. 6A, the field effect transistors $Q_M$, $Q_{nT1}$ and $Q_{nT2}$ are electrically isolated from each other by a field insulator film 2 and a p-type channel stopper region 3. The semiconductor region 14 or 15 of each of the field effect transistors $Q_M$, $Q_{nT1}$, $Q_{nT2}$, $Q_{pT1}$ and $Q_{pT2}$ has a wiring line 18 connected thereto through a contact hole 17 which is formed in an interlayer insulator film 16. The wiring lines 18 are overlaid with a passivation film 19.

Figure 7A:
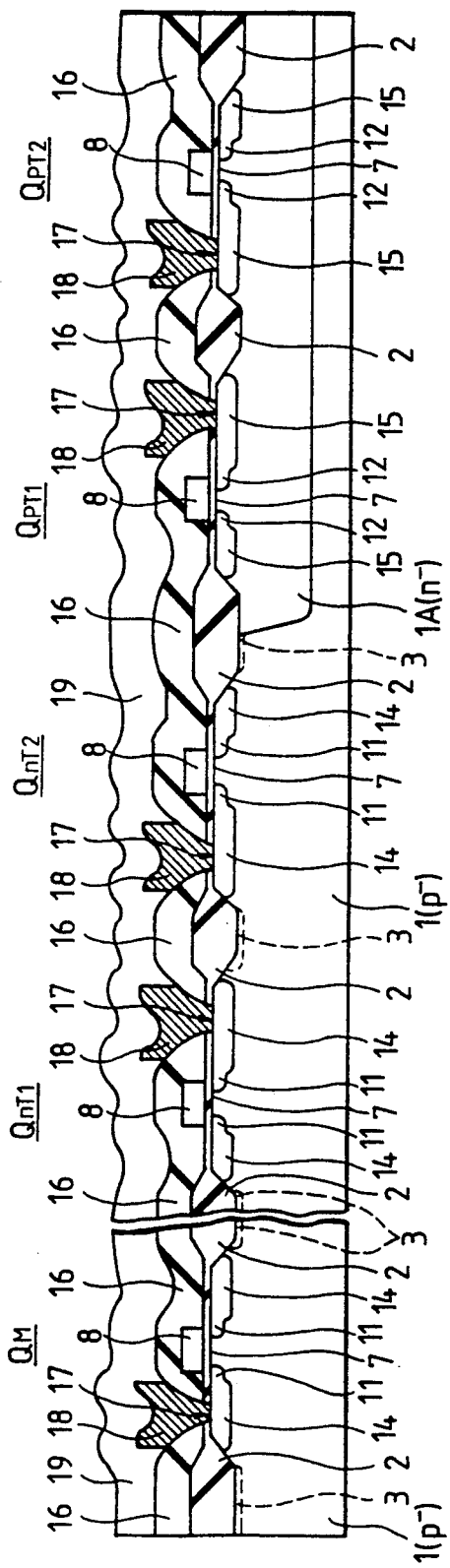
FIG. 7A is a sectional view of the essential portions of the semiconductor integrated circuit device.

On the other hand, as shown in FIG. 7A, the semiconductor integrated circuit device LSI has the EPROM substituted by the mask ROM within the block of the read only memory ROM, and it has a field effect transistor $Q_M$ which forms the memory cell of the substituting mask ROM. The field effect transistor $Q_M$ is formed on the principal surface of a semiconductor substrate 1. It is configured of a gate insulator film 7, a gate electrode 8, and a pair of n-type semiconductor regions 11 and a pair of $n^+$-type semiconductor regions 14 serving as source and drain regions.

Each of the field effect transistors (MISFETs) $Q_{nT1}$, $Q_{nT2}$, $Q_{pT1}$ and $Q_{pT2}$ of the direct and indirect peripheral circuits is constructed of a structure which is similar to that of the field effect transistor $Q_M$ forming the memory cell of this mask ROM, that is, the single-layer gate electrode structure which is formed of the second-layer gate electrode 8.

Thus, in this embodiment, the high breakdown voltage MISFETs $Q_{nT1}$ and $Q_{pT1}$ in the EPROM are replaced with basically the same structure as that of the field effect transistors $Q_{nT2}$ and $Q_{pT2}$ in the EPROM.

Now, the method of fabricating the semiconductor integrated circuit device LSI with the built-in EPROM and the method of fabricating the semiconductor integrated circuit device LSI with the built-in mask ROM as contrasted with the former method will be described by referring also to FIG. 5.

(1) Common Step of Forming Element Isolation Region

Figure 6B:
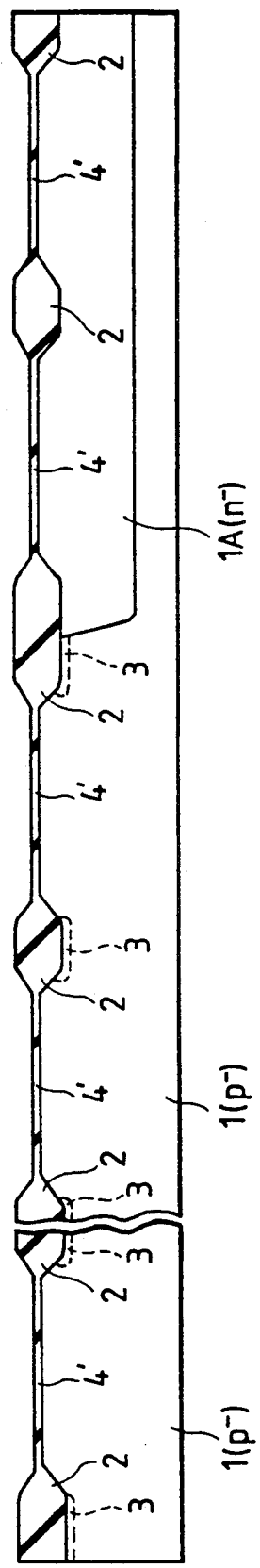

Regarding the semiconductor integrated circuit device LSI with the built-in EPROM, as illustrated in FIG. 6B, an $n^-$-type well region 1A is formed in the predetermined area of the principal surface of a $p^-$-type semiconductor substrate 1.

Subsequently, a field insulator film (silicon oxide film) 2 is formed on the predetermined area of the principal surface of the semiconductor substrate 1 by the known process of selective oxidation, and a p-type channel stopper region 3 is formed by substantially the same manufacturing step.

Figure 7B:
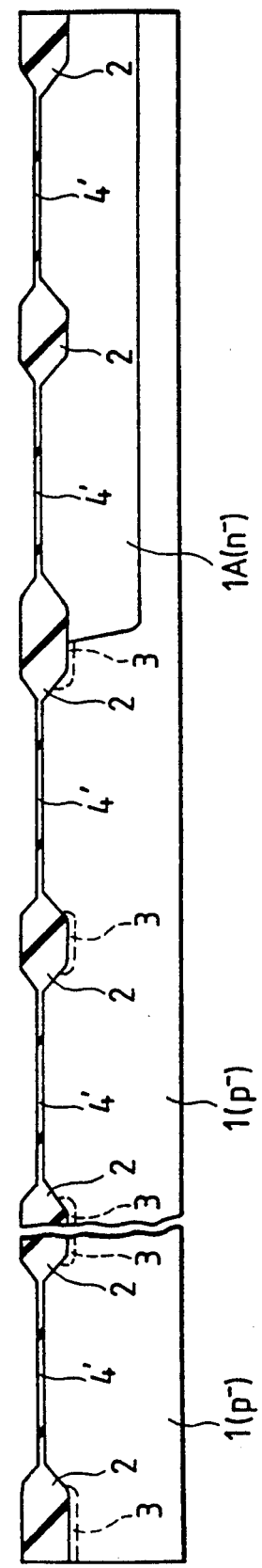

In the case of fabricating the semiconductor integrated circuit device LSI which has the built-in mask ROM replacing the EPROM, an $n^-$-type well region 1A, a field insulator film 2 and a channel stopper region 3 are formed substantially similarly to the above as illustrated in FIG. 7B.

(2) Step of Forming Gate Insulator Film and Gate Electrode

Figure 6C:
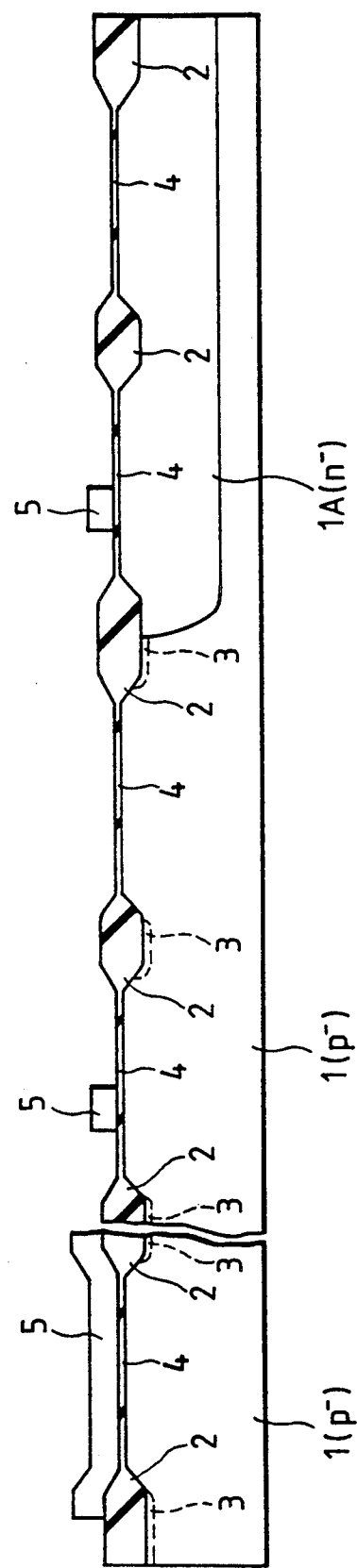

First, in the semiconductor integrated circuit device LSI having the built-in EPROM, the insulator film 4' of each element forming region is removed, and a clean gate insulator film 4 is thereafter formed as shown in FIG. 6C.

By way of example, the gate insulator film 4 is formed of a silicon oxide film at a thickness of about 300–500 [Å] by thermal oxidation. Thereafter, in each of the element forming regions of field effect transistors $Q_{nT1}$, $Q_{pT1}$, an impurity for adjusting the threshold voltage of the transistor is introduced into the principal surface part of the semiconductor substrate 1 by ion implantation or the like.

Subsequently, a polycrystalline silicon film is deposited on the whole surface of the resultant substrate and is patterned as predetermined by anisotropic etching such as RIE (Reactive Ion Etching). Then, the floating gate electrode 5 of a field effect transistor $Q_M$ and the gate electrodes 5 of the field effect transistors $Q_{nT1}$, $Q_{pT1}$ are formed as shown in FIG. 6C.

The polycrystalline silicon film is formed by, for example, CVD, and after the deposition thereof, an n-type impurity such as phosphorus (P) or arsenic (As) is introduced thereinto by ion implantation in order to attain a lower resistivity.

In the semiconductor integrated circuit device LSI having the built-in mask ROM, the step of forming first-layer gate electrodes 5 is, in effect, omitted.

Secondly, in the semiconductor integrated circuit device LSI having the built-in EPROM, the surfaces of the floating gate electrode 5 and the gate electrodes 5 are oxidized into a silicon oxide film. Then, the gate insulator film 6 of the field effect transistor $Q_M$ is formed.

Subsequently, in the element forming regions of field effect transistors $Q_{nT2}$ and $Q_{pT2}$, the gate insulator film is removed.

Subsequently, the whole surface of the resultant substrate is subjected to an oxidizing treatment, thereby to form the gate insulator film 7 of each of field effect transistors $Q_{nT2}$ and $Q_{pT2}$.

By way of example, the gate insulator film 7 is formed of a silicon oxide film at a thickness of about 200–300 [Å] by thermal oxidation or CVD. That is, the gate insulator films of the field effect transistors $Q_{nT2}$, $Q_{pT2}$ are made thinner than those of the field effect transistors $Q_{nT1}$, $Q_{pT1}$.

In the case of forming the semiconductor integrated circuit device LSI in which the mask ROM is built instead of the EPROM, an insulator film 4' is removed in each element forming region, and a clean gate insulator film 7 is thereafter formed.

Thirdly, in the semiconductor integrated circuit device LSI having the built-in EPROM, a predetermined impurity for adjusting a threshold voltage is introduced into each of the element forming regions of the field effect transistors $Q_{nT2}$ and $Q_{pT2}$. Thereafter, a polycrystalline silicon film is deposited on the whole surface of the resultant substrate and is subjected to predetermined patterning in substantially the same way as the step of forming the first-layer gate electrodes 5, whereby gate electrodes 8 are formed as shown in FIG. 6D. The gate electrodes 8 are respectively formed as the control gate electrode 8 of the field effect transistor $Q_M$ and the gate electrodes 8 of the field effect transistors $Q_{nT2}$, $Q_{pT2}$ of the peripheral circuits of the device LSI.

The gate electrode 8 is not restricted to the polycrystalline silicon film, but it may well be formed of a composite film (for example, poly-cide film) in which the polycrystalline silicon film is overlaid with a refractory metal film or a refractory metal silicide film (such as of $WSi_2$). Incidentally, the refractory metal film and the refractory metal silicide film can be formed by CVD or sputtering.

In the case of forming the semiconductor integrated circuit device LSI in which the mask ROM is built instead of the EPROM, gate electrodes 8 are similarly formed on the gate insulator films 7 in correspondence with the step illustrated in FIG. 6D, as shown in FIG. 7C. The gate electrodes 8 are respectively formed as those of the field effect transistors $Q_M$, $Q_{nT1}$, $Q_{nT2}$, $Q_{pT1}$ and $Q_{pT2}$ of this device LSI.

(3) Common Step of Forming Diffusion Layer

Figure 6E:
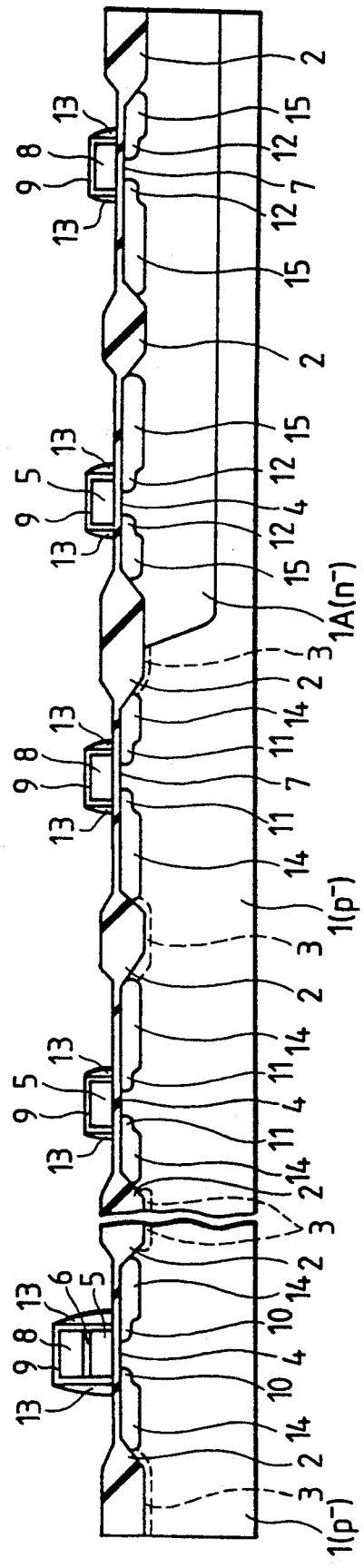

First, in the semiconductor integrated circuit device LSI having the built-in EPROM, an insulator film 9 (silicon oxide film) which mainly covers the floating gate electrode 5 of the field effect transistor $Q_M$ is formed by thermal-oxidation as shown in FIG. 6E. Thus, stored electrons to serve as information can be prevented from escaping from the floating gate electrode 5 of the memory cell of the EPROM. In addition, the insulator film 9 can enhance the breakdown voltage of the end part of the gate electrode 5 or 8.

By the way, the insulator film 9 is not restricted to the thermal oxidation, but it may well be formed by CVD.

Secondly, as illustrated in FIG. 6E, n-type semiconductor regions 10 are formed in the principal surface parts of the semiconductor substrate 1 within the region for forming the field effect transistor $Q_M$. By way of example, the semiconductor regions 10 can be formed in such a way that As (arsenic) is introduced by ion implantation at a dose on the order of $10^{15}$ [atoms/cm$^2$] and an implantation energy level of about 60–100 [keV].

Subsequently, n-type semiconductor regions 11 are formed within the regions for forming the field effect transistors $Q_{nT1}$ and $Q_{nT2}$. By way of example, the semiconductor regions 11 can be formed in such a way that P (phosphorus) is introduced by ion implantation at a dose on the order of $10^{13}$ [atoms/cm$^2$] and an energy level of about 50–80 [keV].

Subsequently, p-type semiconductor regions 12 are formed in the principal surface parts of the n⁻-type well region 1A within the regions for forming the field effect transistors $Q_{pT1}$ and $Q_{pT2}$. For example, the semiconductor regions 12 can be formed in such a way that $BF_2$ ion is introduced by ion implantation at a dose on the order of $10^{13}$ [atoms/cm$^2$] and an energy level of about 40–70 [keV].

Incidentally, the sequence in which the semiconductor regions 10, 11 and 12 are respectviely formed may well be changed.

In this manner, within the region for forming the field effect transistor $Q_M$, the n-type semiconductor regions 10 having the impurity concentration higher than that of the n-type semiconductor regions 11 are formed in the principal surface parts of the semiconductor substrate 1. The semiconductor regions 10 are mainly intended to heighten an electric field intensity in the vicinity of the drain region, thereby to increase the amount of generation of hot carriers.

The semiconductor regions 10, 11 and 12 for constructing the LDD structure are respectively formed in self-alignment with the corresponding ones of the gate electrodes 5,8, the floating gate electrode 5 and the control gate electrode 8.

Subsequently, side-wall spacers 13 are respectively formed on the side walls of the gate electrodes 5, 8, the floating gate electrode 5 and the control gate electrode 8. For example, the side-wall spacers 13 can be formed in such a way that a silicon oxide film deposited by CVD is processed by anisotropic etching such as RIE.

Subsequently, n⁺-type semiconductor regions 14 are formed within the regions for forming the field effect transistors $Q_M$, $Q_{nT1}$ and $Q_{nT2}$. For example, the semiconductor regions 14 can be formed in such a way that As (arsenic) is introduced by ion implantation at a dose on the order of $10^{16}$ [atoms/cm$^2$] and an implantation energy level of about 60–100 [keV]. These semiconductor regions 14 are formed in self-alignment with the corresponding ones of the gate electrodes .5, 8, the floating gate electrode 5 and the control gate electrode 8.

Subsequently, p -type semiconductor regions 15 are formed in the principal surface parts of the n⁻-type well region 1A within the regions for forming the field effect transistors $Q_{pT1}$ and $Q_{pT2}$ For example, the semiconductor regions 15 can be formed in such a way that $BF_2$ ion is introduced by ion implantation at a dose on the order of $10^{15}$ [atoms/cm$^2$] and an energy level of about 40–80 [keV].

Figure 7D:
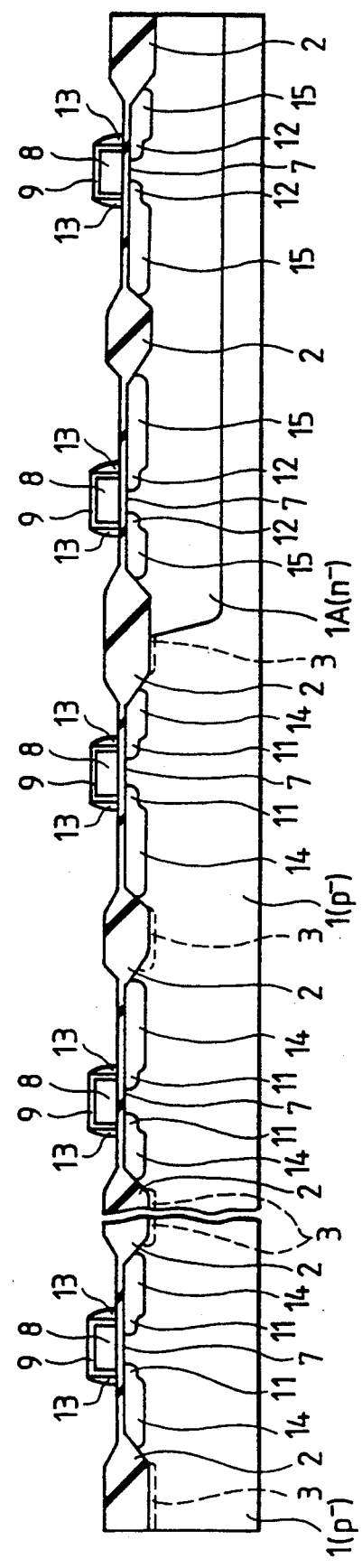

In the case of fabricating the semiconductor integrated circuit device LSI in which the mask ROM is built instead of the EPROM, n-type semiconductor regions 11, n⁺-type semiconductor regions 14, p-type semiconductor region 12 and p⁺-type semiconductor region 15 are similarly formed in correspondence with the steps illustrated in FIG. 6E, as shown in FIG. 7D. The semiconductor regions 11, 14 are formed as those of the respective field effect transistors $Q_M$, $Q_{nT1}$ and $Q_{nT2}$, and the semiconductor regions 12, 15 are formed as those of the respective field effect transistors $Q_{pT1}$ and $Q_{pT2}$.

(4) Common Step of Forming Interlayer Insulator Film

Figure 6F:
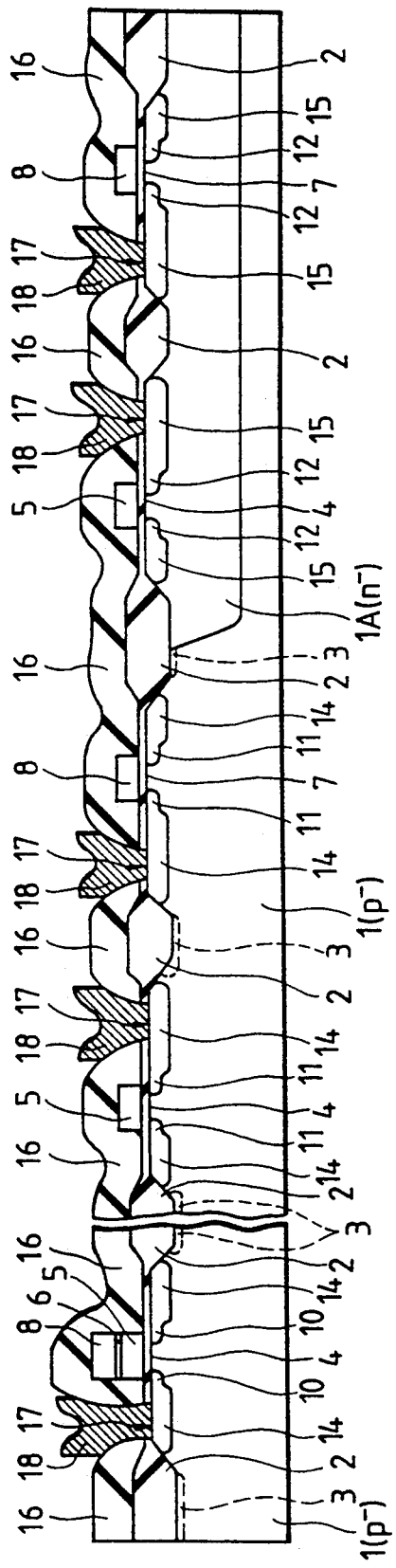

In the semiconductor integrated circuit device LSI having the built-in EPROM, an interlayer insulator film 16 is formed as seen from FIG. 6F.

Figure 7E:
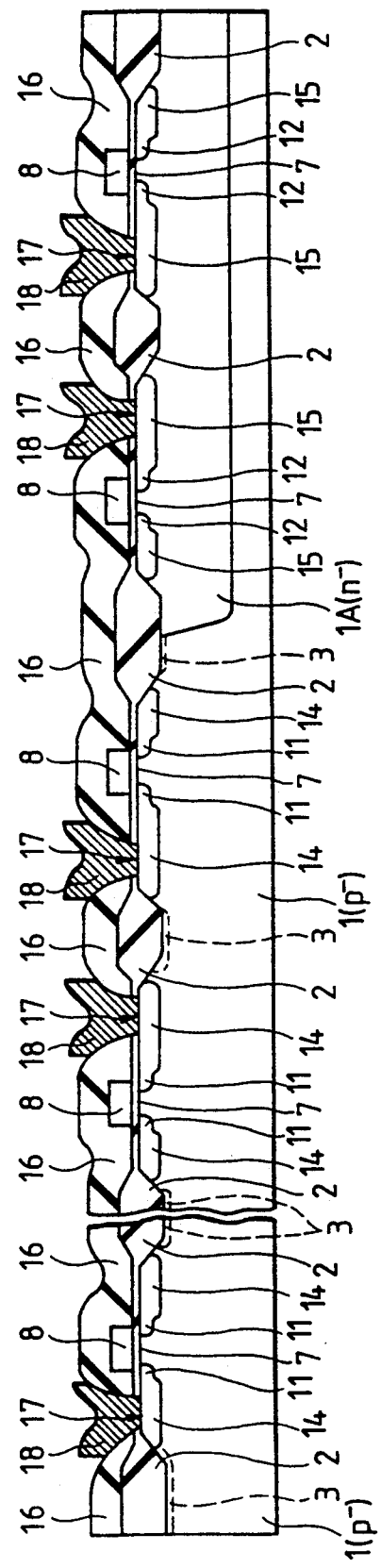

In the case of fabricating the semiconductor integrated circuit device LSI in which the mask ROM is built instead of the EPROM, an interlayer insulator film 16 is similarly formed in correspondence with the above step, as seen from FIG. 7E.

(5) Common Step of Forming Wiring

In the semiconductor integrated circuit device LSI having the built-in EPROM, contact holes 17 are provided in the interlayer insulator film 16. Thereafter, a wiring layer is formed on the whole front surface of the interlayer insulator film 16 and is subjected to predetermined patterning by anisotropic dry etching such as RIE. Thus, wiring lines 18 are formed as shown in FIG. 6F.

In the case of fabricating the semiconductor integrated circuit device LSI in which the mask ROM is built instead of the EPROM, contact holes 17 and wiring lines 18 are similarly and successively formed in correspondence with the above steps, as shown in FIG. 7E.

(6) Step of Writing Information

Figure 7F:
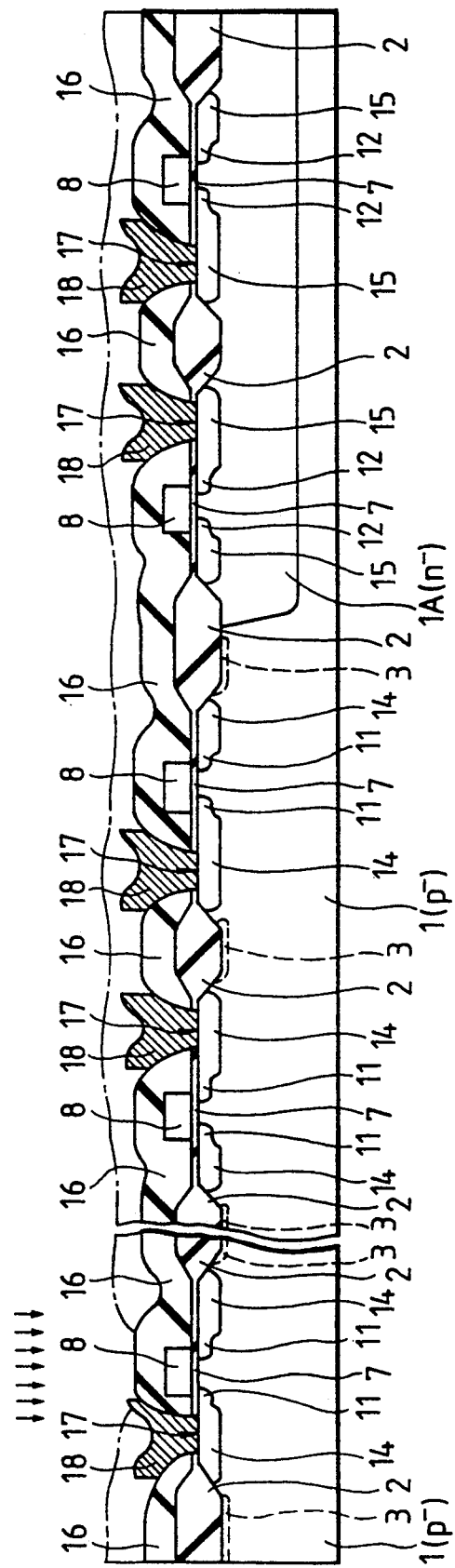

In the semiconductor integrated circuit device LSI having the built-in mask ROM, after the formation of the wiring lines 18, as illustrated in FIG. 7F, a predetermined impurity such as boron (B) is introduced into the channel forming region of each of the predetermined ones of the field effect transistors $Q_M$ through the interlayer insulator film 16 as well as the gate electrode 8, by ion implantation employing a photoresist film indicated by dot-and-dash lines as a mask, whereby the threshold voltage of the field effect transistor $Q_M$ is changed. Thus, the field effect transistors $Q_M$ (memory cells) into which the impurity is not introduced are adapted to turn ON when the corresponding word line W is selected, whereas the field effect transistors $Q_M$ (memory cells) into which the impurity has been introduced are adapted to be OFF even when the corresponding word line W is selected.

Incidentally, the step of writing information is not restricted to the aspect described above, but it may well be performed after each field effect transistor $Q_M$ shown in FIG. 7D has been finished up. Basically, the step of writing information nearer to the final stage of the production process is more favorable because a period of time required till the completion of the product can be shortened.

Alternatively, the step of writing information may well be performed, depending upon whether or not the field insulator film 2 is formed in the element forming region of each field effect transistor $Q_M$, or whether or not the wiring line (data line) 18 is connected to the source region or drain region (semiconductor regions 11, 14) of each field effect transistor $Q_M$.

(7) Common Step of Forming Passivation Film

In the semiconductor integrated circuit device LSI having the built-in EPROM, a passivation film 19 is formed as shown in FIG. 6A.

In the case of fabricating the semiconductor integrated circuit device LSI in which the mask ROM is built instead of the EPROM, a passivation film 19 is similarly formed in correspondence with the above step as shown in FIG. 7A.

By performing the pair of production processes thus far described, the semiconductor integrated circuit device LSI having the built-in EPROM can be formed, and simultaneously, the semiconductor integrated circuit device LSI having the built-in mask ROM can be formed by utilizing the production process of the former device LSI and merely revising parts thereof. That is, the change from the semiconductor integrated circuit device LSI with the built-in EPROM into the semiconductor integrated circuit device LSI with the built-in mask ROM can be effected through the minimum design alterations to both the masks which are used for the circuits and for the production processes.

Incidentally, as seen from FIG. 6A, the high breakdown voltage MISFETs $Q_{nT1}$ and $Q_{pT1}$ are not restricted to the LDD structure, but even when they are constructed of the DD structure, off set gate structure or any other structure of high breakdown voltage, they are easily replaced with the LDD structure in the same way as stated before.

In this manner, a semiconductor integrated circuit device LSI which has a microcomputer CPU furnished with an EPROM is fabricated, a program for controlling the microcomputer CPU and to be set in the EPROM is determined (an initial evaluation is performed) while information is being written into and erased from the EPROM built in the semiconductor integrated circuit device LSI, the EPROM of the semiconductor integrated circuit device LSI is converted into a mask ROM without changing peripheral circuits such as the CPU, and a semiconductor integrated circuit device LSI in which the determined program is set in the mask ROM is fabricated, whereby the development period of the semiconductor integrated circuit device LSI in which the mask ROM is built can be shortened in correspondence with the test period of the peripheral circuits.

As a result, the semiconductor integrated circuit device LSI with the built-in EPROM as is mounted on an electronic apparatus at the stage of the initial evaluation can be easily and promptly substituted by the semiconductor integrated circuit device LSI with the built-in mask ROM being less expensive than the EPROM, after the end of the initial evaluation, so that the cost of the electronic apparatus can be reduced.

In addition, the EPROM built in the semiconductor integrated circuit device LSI can be readily replaced with a lateral mask ROM merely by omitting the step of forming the floating gate electrodes 5 of field effect transistors $Q_M$ which construct the memory cells of the EPROM.

Besides, as regards the replacement, the peripheral circuits required for each of the EPROM and the mask ROM are designed to have basically the same circuit arrangements, so that alterations at the stage of the replacement can be minimized to simplify the initial evaluation including a system check, circuit checks, etc.

Moreover, the specific ones of the peripheral circuits for use in only the EPROM have their circuit regions left as they are in the form of logically inactive regions in the mask ROM which replaces the EPROM, so that the alterations of mask patterns for use in the fabrication of the semiconductor integrated circuit device LSI having the built-in mask ROM can be lessened. That is, the change from the semiconductor integrated circuit device LSI having the built-in EPROM into the semiconductor integrated circuit device LSI having the built-in mask ROM can be effected with the minimum design alterations to both the masks for circuits and for production processes.

Moreover, the change from the semiconductor integrated circuit device LSI having the built-in EPROM into the semiconductor integrated circuit device LSI having the built-in mask ROM can abolish ultraviolet-erasure windows in a package, so that the cost of the package itself can be lowered. Further, the package can be changed from a ceramic package into a resin one, so that the cost of the package can be lowered still more.

Embodiment II

Embodiment II is the second embodiment of the present invention in which, in the semiconductor integrated circuit device of Embodiment I stated before, an EPROM has its memory cells constructed of the single-layer gate electrode structure and is replaced with a mask ROM.

Figure 8A:
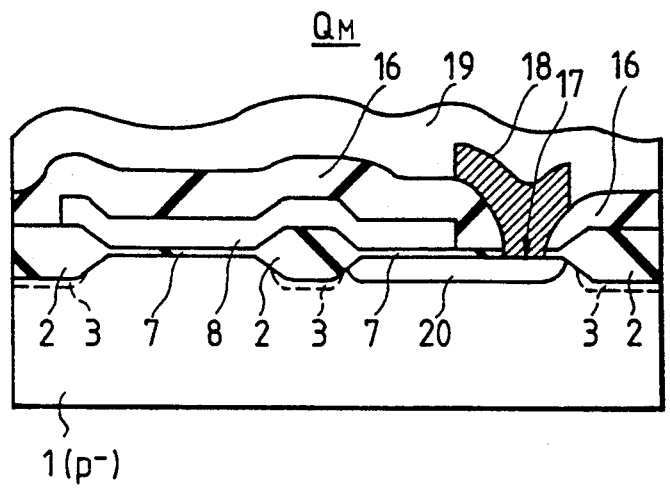
FIG. 8A is a sectional view of essential portions showing the construction of a memory cell in an EPROM built in that semiconductor integrated circuit device having a microcomputer which is Embodiment II of the present invention.

The memory cell of the EPROM built in a semiconductor integrated circuit device LSI being Embodiment II of the present invention is shown in FIG. 8A (a sectional view of essential portions).

As shown in FIG. 8A, the memory cell of the EPROM built in the semiconductor integrated circuit device LSI is constructed of a field effect transistor $Q_M$ which includes a floating gate electrode 8 formed of a second-layer, and a control gate electrode 20 formed of an n+-type semiconductor region. A source region and a drain region are respectively arranged in the direction of the gate length of the floating gate electrode 8.

Next, a practicable method of manufacturing the memory cell of the EPROM will be briefly described with reference to FIGS. 8B and 8C (sectional views of essential portions shown at respective manufacturing steps).

First, likewise to the process for Embodiment I, a field insulator film 2, a p-type channel stopper region 3 and a gate insulator film 7 are successively formed on or in the principal surface of a p−-type semiconductor substrate 1, and an impurity for adjusting the threshold voltage of the field effect transistor QM is introduced.

Figure 8B:
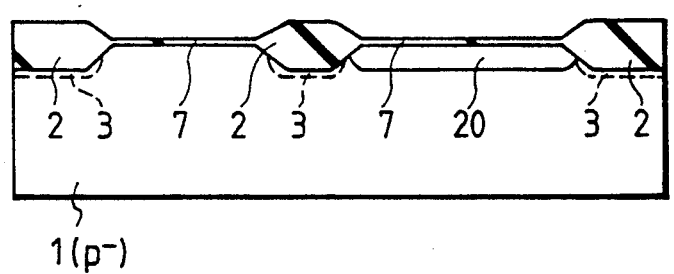
FIGS. 8B and 8C are sectional views of essential portions showing the memory cell at the respective manufacturing steps thereof.

Secondly, as illustrated in FIG. 8B, an n-type impurity is introduced into the principal surface part of the resultant semiconductor substrate 1 by ion implantation or the like, thereby to form the control gate electrode 20.

Figure 8C:
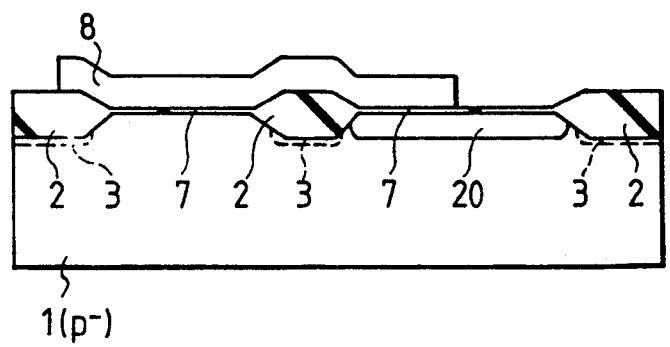

Subsequently, a polycrystalline silicon film is deposited on the whole front surface of the substrate and is patterned as predetermined, whereby the floating gate electrode 8 is formed as shown in FIG. 8C. By the same manufacturing step as this step, the gate electrodes 8 of field effect transistors constituting the peripheral circuits of the EPROM are formed.

Subsequently, semiconductor regions 14 and 15, an interlayer insulator film 16, contact holes 17 and wiring lines 18 are respectively formed in succession in the same way as in the process for Embodiment I. Then, the semiconductor integrated circuit device LSI having the built-in EPROM is finished up.

This EPROM built in the semiconductor integrated circuit device LSI is replaced with the mask ROM by either of the following methods:

(1) The floating gate electrode 8 and the control gate electrode 20 are electrically connected. The connection is effected by, for example, the wiring line 18.

(2) The step of forming the control gate electrode 20 is omitted, and a thick field insulator film 2 is formed in a region corresponding to the control gate electrode. Besides, the floating gate electrode 8 is connected to the wiring line 18 which is used as a word line W.

Thus, the EPROM having the memory cells of the single-layer gate electrode structure and built in the semiconductor integrated circuit device LSI can be replaced with the mask ROM more easily than the EPROM having the memory cells of the double-layer gate electrode structure.

Embodiment III

Embodiment III is the third embodiment of the present invention in which, in the semiconductor integrated circuit device of Embodiment I stated before, a nonvolatile memory circuit adapted to electrically write information thereinto and to electrically erase information therefrom, namely, an EEPROM (Electrically EPROM) is used as a ROM before being replaced with a mask ROM.

Figure 9:
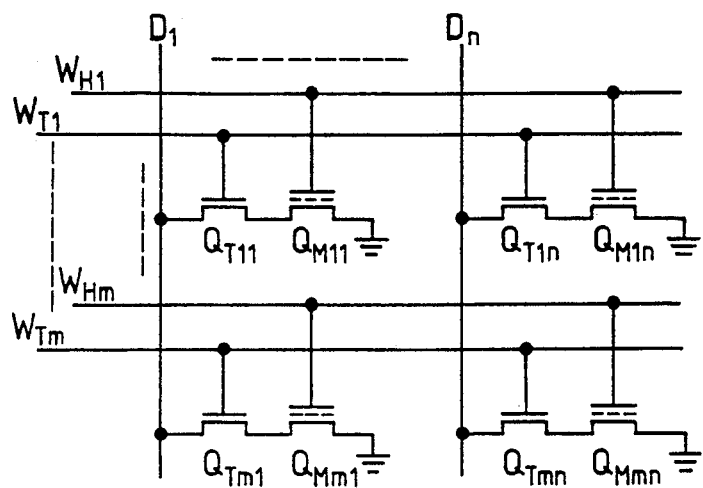
FIG. 9 is an equivalent circuit diagram of an EEPROM built in that semiconductor integrated circuit device having a microcomputer which is Embodiment III of the present invention.

The memory cells of the EEPROM built in a semiconductor integrated circuit device LSI being Embodiment III of the present invention are shown in FIG. 9 (an equivalent circuit diagram).

As illustrated in FIG. 9, the memory cells of the built-in EEPROM of the semiconductor integrated circuit device LSI are configured of field effect transistors $Q_{M11}$ thru $Q_{Mmn}$ each being constructed of a FLOTOX (Floating Gate Tunnel Oxide) type structure which has a floating gate electrode for storing charges and in which electrons are injected into the floating gate electrode by tunneling, and controlling field effect transistors $Q_{T11}$ thru $Q_{Tmn}$ which are respectively connected in series with the corresponding field effect transistors $Q_{M11}$ thru $Q_{Mmn}$. The controlling field effect transistors $Q_{T11}$ thru $Q_{Tmn}$ are connected to data lines $D_1$ thru $D_n$ and are also connected to word lines $W_{T1}$ thru $W_{Tm}$, thereby to be arranged in the shape of a matrix. In addition, the control gate electrodes of the field effect transistors $Q_{M11}$ thru $Q_{Mmn}$ are connected to word lines $W_{M1}$ thru $W_{Mm}$ which are respectively laid in parallel with the word lines $W_{T1}$ thru $W_{Tm}$.

Since the information writing operation and information erasing operation of the EEPROM are known, they shall not be especially explained.

Methods of substituting the mask ROM for the EEPROM built in the semiconductor integrated circuit device LSI will be described below. Since methods of forming peripheral circuits are substantially the same as in Embodiment I, they shall be omitted here.

(1) Case of Replacing Controlling Field Effect Transistors QT of Memory Cells with Mask ROM The controlling field effect transistor $Q_T$ of each memory cell can be replaced with the memory cell of the mask ROM as it is without altering the basic structure thereof. In replacing the the field effect transistor $Q_T$ with the mask ROM, the FLOTOX type field effect transistor $Q_M$ of the memory cell and the word line $W_M$ connected thereto are removed. Since the portion of the field effect transistor $Q_M$ is formed as a diffusion layer and operates as a mere resistor, it exerts no influence on the construction of the mask ROM.

(2) Case of Replacing FLOTOX Type Field Effect Transistors $Q_M$ of Memory Cells with Mask ROM The FLOTOX type field effect transistor $Q_M$ of each memory cell can be replaced with the memory cell of the mask ROM substantially in the same way as in Embodiment I. In replacing the field effect transistor $Q_M$ with the mask ROM, the controlling field effect transistor $Q_T$ of the memory cell and the word line $W_T$ connected thereto are removed. Since the portion of the field effect transistor $Q_T$ is formed as a diffusion layer and operates as a mere resistor, it exerts no influence on the construction of the mask ROM.

By substituting the mask ROM for the built-in EEPROM of the semiconductor integrated circuit device LSI in this manner, effects substantially identical to those of Embodiment I can be achieved.

Embodiment IV

Embodiment IV is the fourth embodiment of the present invention in which a mask ROM is substituted for a programmable logic array PLA employing an EPROM as a logic function determining device.

Figure 10:
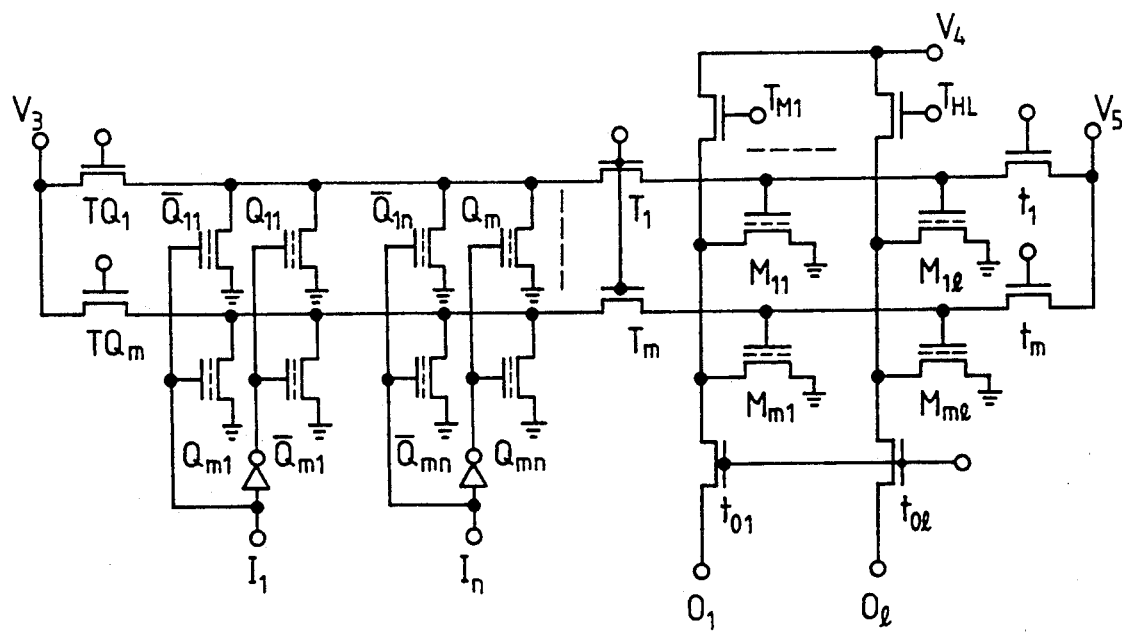
FIG. 10 is an equivalent circuit diagram of a PLA (Programmable Logic Array) built in that semiconductor integrated circuit having a microcomputer which is Embodiment IV of the present invention.

The arrangement of the programmable logic array PLA built in a semiconductor integrated circuit device LSI being Embodiment IV of the present invention is shown in FIG. 10 (an equivalent circuit diagram).

Since methods of writing information into the built-in programmable logic array PLA of the semiconductor integrated circuit device LSI shown in FIG. 10 are known, they shall be briefly explained.

First, information is written into a logic cell $\overline{Q_{11}}$ lying in an AND array, as follows:

(1) A controlling transistor $T_1$ interposed between the AND array and an OR array is brought into its OFF state, and a potential $V_3$ is set at a write voltage.

(2) After the write voltage has been applied to an input $I_1$, a load transistor $TQ_1$ is brought into its ON state, thereby to write the information into the logic cell $\overline{Q_{11}}$.

Secondly, information is written into a logic cell $M_{11}$ lying in the OR array, as follows:

(1) Controlling transistors $T_1$-$T_m$ and $t_{o1}$-$t_{ol}$ are brought into their OFF states, and potentials $V_4$ and $V_5$ are set at the write voltage.

(2) A load transistor $T_{M1}$ and a controlling transistor $t_1$ are brought into their ON states, thereby to write the information into the logic cell $M_{11}$. In case of using the programmable logic array PLA as usual, controlling transistors $T_1$-$T_m$ and $t_1$-$t_m$ are brought into their OFF states, the controlling transistors $t_{o1}$-$t_{ol}$ are brought into their ON states, and potentials $V_3$ and $V_4$ are set at predetermined values.

Since a method of substituting the mask ROM for the EPROM used in the programmable logic array PLA is substantially the same as in Embodiment I, it shall be omitted here.

In this manner, the semiconductor integrated circuit device LSI in which the programmable logic array PLA formed of the EPROM is built is substituted by the semiconductor integrated circuit device LSI in which the mask ROM is built, whereby effects substantially identical to those of Embodiment I can be achieved.

Besides, in each of Embodiments I thruough IV described above, the present invention can substitute an EPROM or an EEPROM for the mask ROM built in the semiconductor integrated circuit device LSI.

Although, in the above, the invention made by the inventor has been concretely described in conjunction with the embodiments, it is a matter of course that the present invention is not restricted to the foregoing embodiments, but that it can be variously altered within a scope not departing from the purport thereof.

By way of example, the present invention may well employ a vertical EPROM and substitute it by a vertical mask ROM.

An effect which is attained by a typical aspect of performance of the present invention is briefly explained as follows:

In a semiconductor integrated circuit device having a microcomputer which is furnished with a nonvolatile memory circuit, a development period for converting the nonvolatile memory circuit into another nonvolatile memory circuit can be shortened.

What is claimed is:

1. A method of fabricating a second semiconductor integrated circuit device, on a semiconductor substrate, from a first semiconductor integrated circuit device on the substrate, where the second semiconductor integrated circuit device has a second nonvolatile memory circuit for only reading information, comprising the step of:

converting the first semiconductor integrated circuit device, which includes a first nonvolatile memory circuit capable of having information electrically written thereinto and capable of having the information erased therefrom, into the second semiconductor integrated circuit device, wherein the first nonvolatile memory circuit includes an information writing circuit means, an information reading circuit means, and memory cells comprised of memory cell MISFETs, wherein the memory cell MISFETs have floating gate electrodes over the substrate and control gate electrodes over the floating gate electrodes, wherein the floating gate electrodes are formed of a first level layer of gate electrodes, and wherein the control gate electrodes are formed of a second level layer of gate electrodes, the first semiconductor integrated circuit device further including a microcomputer which is comprised of MISFETs, MISFETs of the microcomputer having first gate insulating films on the substrate and first gate electrodes on the first gate insulating films, wherein the first gate electrodes are formed of the second level layer of gate electrodes, the converting step including the sub-steps of:

revising the memory cell MISFETs of the first nonvolatile memory circuit in such a manner that the revised memory cell MISFETs have second gate insulating films on the substrate and second gate electrodes on the second gate insulating films, the second gate electrodes corresponding to the second level layer of gate electrodes in the first semiconductor integrated circuit device; and leaving the microcomputer in such a manner that the MISFETs of the microcomputer have third gate insulating films on the substrate and third gate electrodes on the third gate insulating films, wherein the third gate electrodes correspond to the second level layer of gate electrodes in the first semiconductor integrated circuit device.

2. A method of fabricating a second semiconductor integrated circuit device according to claim 1, wherein, in said converting step, the second level layer of gate electrodes, and not the first level layer of gate electrodes, are formed.

3. A method of fabricating a second semiconductor integrated circuit device according to claim 1, wherein circuit blocks except the first nonvolatile memory circuit blocks except the first nonvolatile memory circuit are comprised of the MISFETs which have the first gate electrodes formed of the second level layer of gate electrodes in the first semiconductor integrated circuit device.

4. A method of fabricating a second semiconductor integrated circuit device according to claim 1, wherein the information writing circuit means and an information reading circuit means are comprised of first MISFETs and second MISFETs in the first semiconductor integrated circuit device, wherein gate electrodes of the first MISFETs are formed of the first level layer of gate electrodes, wherein gate electrodes of the second MISFETs are formed on the second level layer of gate electrodes, and wherein said converting step further includes the sub-step of revising the first and second MISFETs in such a manner that the first and second MISFETs have fourth gate insulating films on the substrate and fourth gate electrodes on the fourth gate insulating films, wherein the fourth gate electrodes correspond to the second level layer of gate electrodes in the first semiconductor integrated circuit device.

5. A method of fabricating a second semiconductor integrated circuit device according to claim 4, wherein the first MISFET has a fifth gate insulating film and the gate electrode thereon, wherein the second MISFET has a sixth gate insulating film and the gate electrode thereon, the fifth gate insulating film having a film thickness greater than that of the sixth gate insulating film.

6. A method of fabricating a second semiconductor integrated circuit device according to claim 1, wherein the first semiconductor integrated circuit device is converted into the second semiconductor integrated circuit device without changing the microcomputer of the first semiconductor integrated circuit device.

7. A method of fabricating a second semiconductor integrated circuit device according to claim 1, wherein the first level layer of gate electrodes in the first semiconductor integrated circuit device is made of a polycrystalline silicon film, wherein the second level layer of gate electrodes in the first semiconductor integrated circuit device is made of a polycrystalline silicon film and a refractory metal silicide film on the polycrystalline silicon film, and wherein the second and third gate electrodes are made of a polycrystalline silicon film and a refractory metal silicide film on the polycrystalline silicon film.

8. A method of fabricating a second semiconductor integrated circuit device according to claim 1, further comprising the sub-step of revising circuit constants of MISFETs which are included in the information reading circuit means.

9. A method of fabricating a second semiconductor integrated circuit device according to claim 8, wherein the sub-step of revising circuit constants is carried out without changing a circuit arrangement of the information reading circuit means.

10. A method of fabricating a second semiconductor integrated circuit device according to claim 1, wherein the first nonvolatile memory circuit is an Erasable and Programmable Read Only Memory (EPROM), and the second nonvolatile memory circuit is a mask Read Only Memory.

11. A method of fabricating a second semiconductor integrated circuit device according to claim 1, wherein the first nonvolatile memory circuit is an Electrically Erasable and Programmable Read Only Memory (EEPROM), and the second nonvolatile memory circuit is a mask Read Only Memory.

12. A method of fabricating a second semiconductor integrated circuit device according to claim 1, wherein the revising sub-step is performed such that the revised memory cell MISFETs have only said second gate electrodes corresponding to the second level layer of gate electrodes in the first semiconductor integrated circuit device, as gate electrodes of the revised memory cell MISFETs.

13. A method of fabricating a second semiconductor integrated circuit device according to claim 1, wherein the first semiconductor integrated circuit device includes peripheral circuitry having peripheral circuit MISFETs, the peripheral circuit MISFETs having peripheral circuit MISFET gate electrodes corresponding to the second level layer of gate electrodes in the first semiconductor integrated circuit device, and wherein the converting step further includes leaving the peripheral circuit MISFETs having said peripheral circuit MISFET gate electrodes corresponding to the second level layer of gate electrodes in the first semiconductor integrated circuit device.

14. A method of fabricating a second semiconductor integrated circuit device according to claim 1, wherein the sub-step of revising includes substituting memory cell MISFETs of the second nonvolatile memory circuit for memory cell MISFETs of the first nonvolatile memory circuit, the memory cell MISFETs of the second nonvolatile memory circuit not having gate electrodes formed of the first level layer of gate electrodes.

15. A method of fabricating a second semiconductor integrated circuit device according to claim 1, wherein memory cell MISFETs of the second nonvolatile memory circuit include gate electrodes, the gate electrodes of memory cell MISFETs of the second nonvolatile memory circuit being formed by processing steps that do not include processing steps for forming the first level layer of gate electrodes.

16. A method of fabricating a second semiconductor integrated circuit device, on a semiconductor substrate, from a first semiconductor integrated circuit device on the substrate, where the second semiconductor integrated circuit device has a mask ROM, comprising the step of:

converting the first semiconductor integrated circuit device, which includes memory circuit means for storing instructions, into the second semiconductor integrated circuit device, wherein said memory circuit means includes memory cell MISFETs, the memory cell MISFETs having floating gate electrodes over the substrate and control gate electrodes over the floating gate electrodes, the floating gate electrodes being formed of a first level layer of gate electrodes, and the control gate electrodes being formed of a second level layer of gate electrodes, the first semiconductor integrated circuit device further including microcomputer means, comprised of MISFETs, for executing operations, instructions for operating the microcomputer mean being stored in the memory circuit means, the MISFETs of the microcomputer means having first gate insulating films on the substrate and first gate electrodes on the first gate electrodes are formed of the second level layer of gate electrodes, the converting step including the sub-steps of:

revising the memory cell MISFETs of the memory circuit means in such a manner that revised memory cell MISFETs have second gate insulating films on the substrate and second gate electrodes on the second gate insulating films, the second gate electrodes corresponding to the second level layer of gate electrodes in the first semiconductor integrated circuit device; and leaving the microcomputer means in such a manner that the MISFETs of the microcomputer means have third gate insulating films on the substrate and third gate electrodes on the third gate insulating films, the third gate electrodes corresponding to the second level layer of gate electrodes in the first semiconductor integrated circuit device.

17. A method of fabricating a second semiconductor integrated circuit device according to claim 16, wherein the revised memory cell MISFETs, after said revising sub-step, have gate electrodes formed by processing steps that do not include processing steps for forming the first level layer of gate electrodes.

18. A method of fabricating a second semiconductor integrated circuit device according to claim 17, wherein said revising sub-step is carried out such that electrical characteristics of the MISFETs of the microcomputer means remain unchanged from before, to after, the revising sub-step.

19. A method of fabricating a second semiconductor integrated circuit device according to claim 16, wherein gate electrodes of the revised memory cell MISFETs, after the revising sub-step, consist of the second gate electrodes corresponding to the second level layer of gate electrodes in the first semiconductor integrated circuit device.

20. A method of fabricating a second semiconductor integrated circuit device according to claim 16, wherein said revising sub-step is carried out such that electrical characteristics of the MISFETs of the microcomputer means remain unchanged from before, to after, the revising sub-step.

21. A method of fabricating a second semiconductor integrated circuit device according to claim 16, wherein the revised memory cell MISFETs, after the revising sub-step, have gate electrodes that do not include the first level layer of gate electrodes.

22. A method of fabricating a second semiconductor integrated circuit device according to claim 16, wherein the first level layer of gate electrodes in the first semiconductor integrated circuit device is made of a polycrystalline silicon film, wherein the second level layer of gate electrodes in the first semiconductor integrated circuit device is made of a polycrystalline silicon film and a refractory metal silicide film on the polycrystalline silicon film, and wherein the polycrystalline silicon film and a refractory metal silicide film on the polycrystalline silicon film, and wherein the second and third gate electrodes are made of a polycrystalline silicon film and a refractory metal silicide film on the polycrystalline silicon film.

23. A method of fabricating a second semiconductor integrated circuit device, on a semiconductor substrate, from a first semiconductor integrated circuit device on the substrate, where the second semiconductor integrated circuit device has a mask ROM, comprising the step of:

converting the first semiconductor integrated circuit device, which includes memory circuit means for storing instructions, into the second semiconductor integrated circuit device, wherein said memory circuit means includes memory cell MISFETs, the memory cell MISFETs having floating gate electrodes over the substrate and control gate electrodes, the floating gate electrodes being formed of a second level layer of gate electrodes, the first semiconductor integrated circuit device further including microcomputer means, comprised of MISFETs, for executing operations, instructions for operating the microcomputer means being stored in the memory circuit means, the MISFETs of the microcomputer means having first gate insulating films on the substrate and first gate electrodes on the first gate insulating films, wherein the first gate electrodes are formed of the second level layer of gate electrodes, the converting step including the sub-steps of:

revising the memory cell MISFETs of the memory circuit means in such a manner that revised memory cell MISFETs have second gate insulating films on the substrate and second gate electrodes on the second gate insulating films, the second gate electrodes corresponding to the second level layer of gate electrodes in the first semiconductor integrated circuit device; and leaving the microcomputer means in such a manner that the MISFETs of the microcomputer means have third gate insulating films on the substrate and third gate electrodes on the third gate insulating films, the third gate electrodes corresponding to the second level layer of gate electrodes in the first semiconductor integrated circuit device.

24. A method of fabricating a second semiconductor integrated circuit device according to claim 23, wherein the control gate electrodes are formed of a semiconductor region in the semiconductor substrate.

25. A method of fabricating a second semiconductor integrated circuit device according to claim 23, wherein the revised memory cell MISFETs, after the revising sub-step, have gate electrodes formed by processing steps that do not include processing steps for forming a first level layer of gate electrodes.

26. A method of fabricating a second semiconductor integrated circuit device according to claim 23, wherein gate electrodes of the revised memory cell MISFETs, after said revising sub-step, consist of the second gate electrodes corresponding to the second level layer of gate electrodes in the first semiconductor integrated circuit device.

* * * * *